United States Patent
Asaoka et al.

(10) Patent No.: US 8,982,630 B2
(45) Date of Patent: Mar. 17, 2015

(54) NON-VOLATILE SEMICONDUCTOR MEMORY DEVICE

(71) Applicant: Kabushiki Kaisha Toshiba, Minato-ku (JP)

(72) Inventors: Norichika Asaoka, Yokohama (JP); Masanobu Shirakawa, Chigasaki (JP); Kiyotaro Itagaki, Naka-gun (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/292,440

(22) Filed: May 30, 2014

(65) Prior Publication Data
US 2014/0269084 A1 Sep. 18, 2014

Related U.S. Application Data

(63) Continuation of application No. 13/419,953, filed on Mar. 14, 2012, now Pat. No. 8,767,466.

(30) Foreign Application Priority Data

Mar. 25, 2011 (JP) ................................. 2011-068986

(51) Int. Cl.
*G11C 11/24* (2006.01)
*G11C 16/04* (2006.01)
(Continued)

(52) U.S. Cl.
CPC ............ *G11C 16/04* (2013.01); *G11C 16/0483* (2013.01); *H01L 27/1157* (2013.01); *H01L 27/11582* (2013.01); *G11C 16/10* (2013.01); *G11C 2213/71* (2013.01)
USPC ............. 365/185.17; 365/185.18; 365/185.29

(58) Field of Classification Search
CPC ........... G11C 16/0483; G11C 16/3404; G11C 16/3445
USPC ........................... 365/185.17, 185.18, 185.29
See application file for complete search history.

(56) References Cited

U.S. PATENT DOCUMENTS 7,492,643 B2 * 2/2009 Takeuchi ................. 365/185.28
7,948,796 B2    5/2011 Fujimura et al.
(Continued)

FOREIGN PATENT DOCUMENTS

JP    2009-301607 A    12/2009
JP    2010-199235       9/2010

OTHER PUBLICATIONS

Japanese Office Action Issued Jun. 18, 2013 in Patent Application No. 2011-068986 (with English translation).

*Primary Examiner* — Tuan T Nguyen
(74) *Attorney, Agent, or Firm* — Oblon, McClelland, Maier & Neustadt, L.L.P.

(57) ABSTRACT

When performing a data erase operation, the control circuit generates positive holes at least at any one of the drain side select transistor and the source side select transistor, and supply the positive holes to a body of the memory string to raise a voltage of the body of the memory string to a first voltage. Then, it applies a voltage smaller than the first voltage to a first word line among the plurality of word lines during a first time period. In addition, it applies a voltage smaller than the first voltage to a second word line different from the first word line during a second time period.
The second time period is different from the first time period.

16 Claims, 21 Drawing Sheets

(51) Int. Cl.
*H01L 27/115* (2006.01)
*G11C 16/10* (2006.01)

(56) References Cited

U.S. PATENT DOCUMENTS

| | | |
|---|---|---|
| 8,107,286 B2 | 1/2012 | Itagaki et al. |
| 8,565,019 B2 | 10/2013 | Honda et al. |
| 2008/0089133 A1* | 4/2008 | Ito .................. 365/185.22 |
| 2008/0180994 A1 | 7/2008 | Katsumata et al. |
| 2009/0129157 A1 | 5/2009 | Honda et al. |
| 2010/0214838 A1 | 8/2010 | Hishida et al. |
| 2011/0063914 A1 | 3/2011 | Mikajiri et al. |
| 2011/0069552 A1 | 3/2011 | Itagaki et al. |
| 2013/0010541 A1 | 1/2013 | Futatsuyama et al. |

\* cited by examiner $$\begin{pmatrix} * \\ V_{CG1} > V_{CG2} > V_{CG3} > V_{CG4} \\ V_{CG8} > V_{CG7} > V_{CG6} > V_{CG5} \end{pmatrix}$$

$$E_{i+1} = E_i \frac{r_i}{r_{i+1}(W+d_w)\tan\theta}$$

* $V_{CG3}' < V_{CG2}' < V_{CG4}' < V_{CG1}'$
  $V_{CG6}' < V_{CG7}' < V_{CG5}' < V_{CG8}'$

* $V_{CG3}' > V_{CG2}' > V_{CG4}' > V_{CG1}'$
  $V_{CG6}' > V_{CG7}' > V_{CG5}' > V_{CG8}'$

NON-VOLATILE SEMICONDUCTOR MEMORY DEVICE

CROSS REFERENCE TO RELATED APPLICATIONS

This application is a continuation of and claims the benefit of priority under 35 U.S.C. §120 from U.S. Ser. No. 13/419,953, filed Mar. 14, 2012, which is based upon and claims the benefit of priority from prior Japanese Patent Application No. 2011-68986, filed on Mar. 25, 2011, the entire contents of each of which are incorporated herein by reference.

FIELD

Embodiments described herein relate to a non-volatile semiconductor memory device.

BACKGROUND

A non-volatile semiconductor memory device of lamination type has been proposed recently in which memory cells are arranged three-dimensionally in order to raise a degree of integration of the memory.

DETAILED DESCRIPTION

A non-volatile semiconductor memory device according to embodiments described hereinbelow includes: a semiconductor substrate; a memory string including a plurality of memory cells connected in series, and extending in a direction perpendicular to the semiconductor substrate; a drain side select transistor connected to one end of the memory string;

a source side select transistor connected to the other end of the memory string; a plurality of word lines connected to the memory cells; a plurality of bit lines connected to the drain side select transistor; and a control circuit configured to control voltages to be applied to the drain side select transistor, the source side select transistor, the word lines, and the bit lines. When performing a data erase operation, the control circuit supply positive holes to a body of the memory string to raise a voltage of the body of the memory string to a first voltage. It also applies a voltage smaller than the first voltage to a first word line among the plurality of the word lines during a first time period. Then it applies a voltage smaller than the first voltage to a second word line different from the first word line during a second time period, the second time period being different from the first time period.

Embodiments of the non-volatile semiconductor memory device according to the present invention are described with reference to the drawings hereinbelow.

First Embodiment

Figure 1:
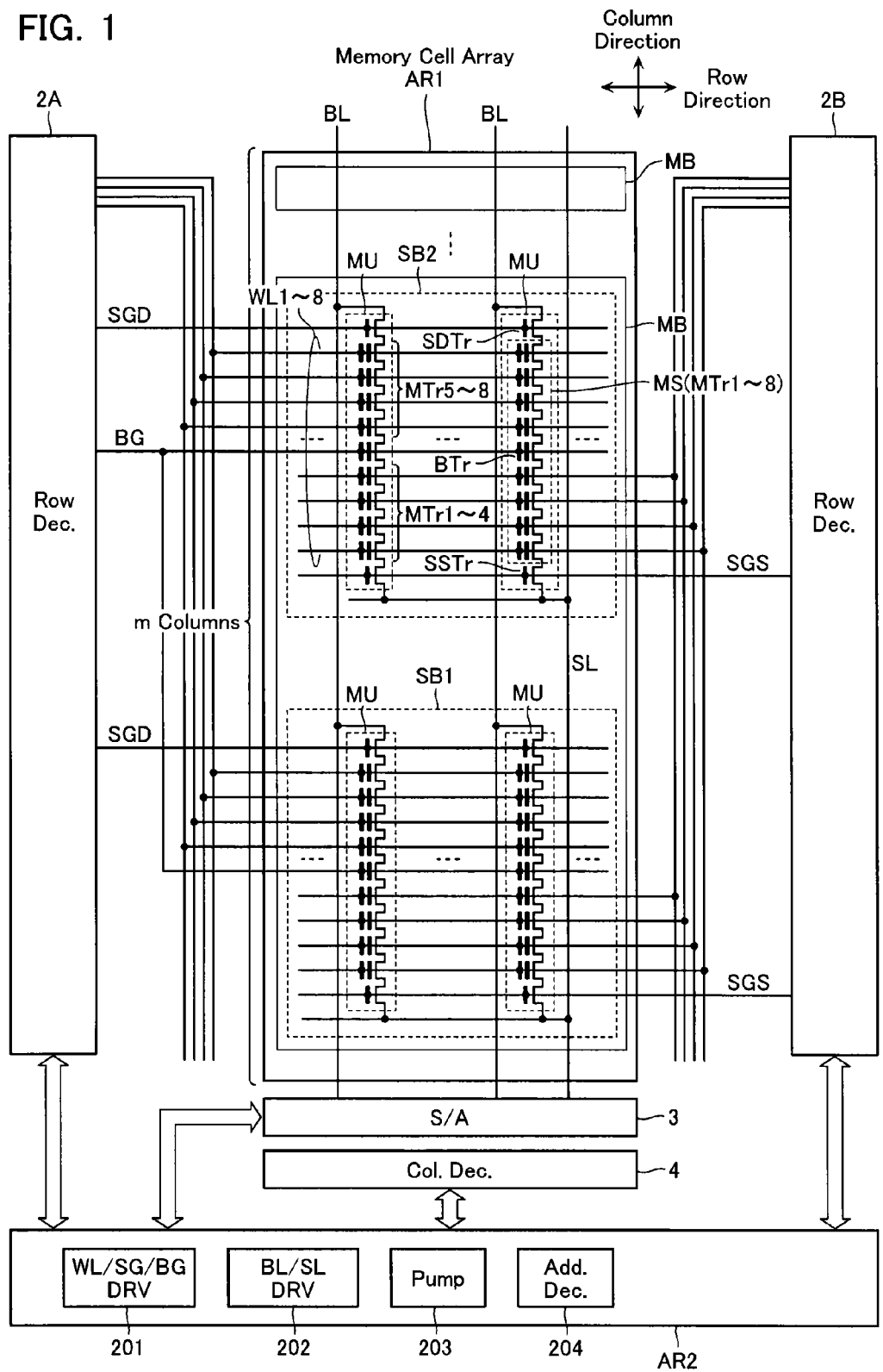
FIG. 1 is a circuit diagram showing an entire structure of the non-volatile semiconductor memory device according to the first embodiment.

Referring now to FIG. 1, the entire structure of the non-volatile semiconductor memory device according to the first embodiment is described.

FIG. 1 is a circuit diagram of the non-volatile semiconductor memory device according to first embodiment.

As shown in FIG. 1, the non-volatile semiconductor memory device according to first embodiment has a memory cell array AR1, row decoders 2A and 2B provided in the vicinity of the memory cell array AR1, a sense amplifier circuit 3, a column decoder 4, and a control circuit AR2.

In the memory cell array AR1, memory strings MS are arraigned in matrix, as shown in FIG. 1. Each of the memory strings is configured by electrically-rewritable memory cells MTr1-8 and aback gate transistor BTr connected in series.

The row decoders 2A and 2B are arranged at the left side of the memory cell array AR1 and the right side thereof, respectively. The row decoder 2A and 2B drive word lines WL, selection gate lines SGD, SGS, and a back gate line BG, according to an address signal provided from the control circuit AR. The column decoder 4 selects an address to perform writing and reading, based on an address signal provided from the control circuit AR2. The sense amplifier circuit 3 determines data stored in a memory cell in a read operation. In addition, the sense amplifier circuit 3 drives a bit line BL and a source line SL according to an address signal supplied via the column decoder 4 from the control circuit AR2.

The control circuit AR2 has a function of controlling voltages to be applied to the memory cell MTr and the like. The control circuit AR2 comprises: a driver 201 for driving the word lines WL, selection gate lines SGD, SGS and a back gate line BG; a driver 202 for driving the bit line BL and the source line SL; a charge pump circuit 203 for boosting a power supply voltage up to a certain voltage; and an address decoder 204.

The control circuit AR2 performs a write operation for writing data to a memory cell MTr, an erase operation for erasing data from the memory cell MTr, and a read operation for reading data from the memory cell MTr.

The memory cell array AR1 has m columns of memory blocks MB, as shown in FIG. 1. Each of the memory blocks MB has memory units MU arranged in matrix, for example, in n lines and 2 columns.

The memory unit MU comprises: the memory string MS; a drain side select transistor SDTr connected to the drain side of the memory string MS; a source side select transistor SSTr connected to the source side of the memory string MS; and a back gate transistor BTr. Note that, in the example shown in FIG. 1, the memory units MU in a first column are referred to as a subblock SB1, and those in a second column are referred to as a subblock SB2. In FIG. 1, explanation is provided for a case where there are two subblocks SB1 and SB2 in one memory block MB. It is needless to say that the present invention is not limited to this case. It is possible that three or more subblocks are provided in one memory block MB.

The M pieces of memory blocks MB share the same bit lines BL. That is, the bit lines BL extend in a column direction as shown in FIG. 1, and each of the bit lines BL is connected to a plurality of memory units MU (a plurality of the drain side select transistors SDTr) arranged in a line along the column direction in the M pieces of the memory blocks MB.

In each of the memory blocks MB, two memory units MU arranged along the column direction are commonly connected to the same bit line BL.

In each of the memory blocks MB, (n×2) pieces of the memory units MU share the corresponding word lines WL and the back gate line BG. Also, n pieces of the memory units MU arranged along the row direction share the selection gate line SGD and the selection gate line SGS. That is, a plurality of memory units MU having a plurality of the drain side select transistor SDTr and a plurality of the source side select transistor SSTr each commonly connected to one of the drain side selection gate line SGD and one of the source side selection gate line SGS, respectively, form one subblock.

Figure 2:
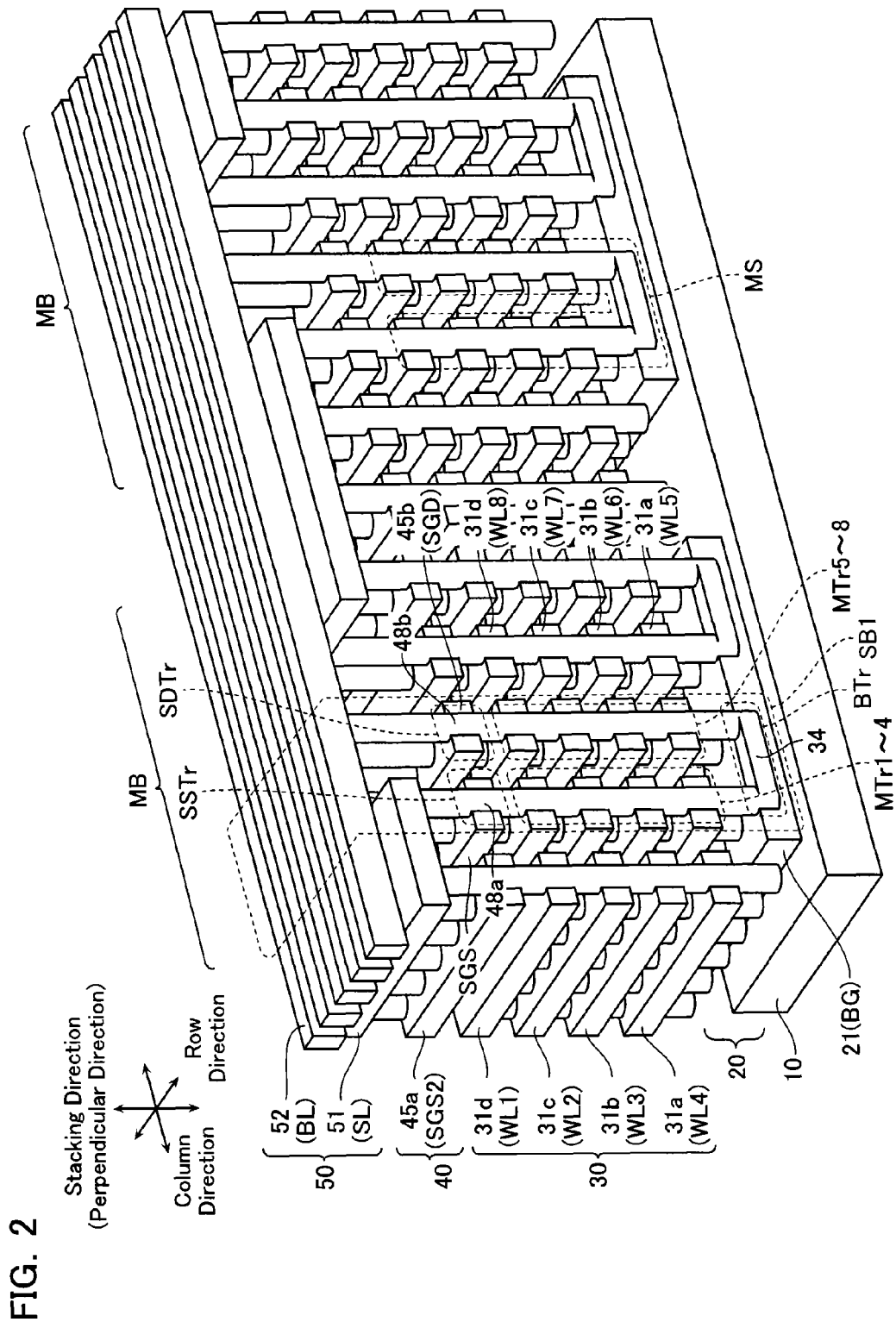
FIG. 2 is a schematic perspective diagram of the memory cell array AR1 of FIG. 1.

In the memory cell array AR1, memory cells MTr are three-dimensionally arranged in matrix, as shown in FIG. 2. That is, the memory cells MTr are arranged in matrix in a horizontal direction, as well as in a stacking direction (a vertical direction to the substrate). A plurality of the memory cells MTr1-4, and a plurality of the memory cells MTr5-8 are connected in series, respectively. The above-mentioned memory string MS includes the memory cells MTr1-4, and MTr5-8. The drain side select transistor SDTr is connected to the drain side of the memory string MS, and the source side select transistor SSTr is connected to the source side thereof. The drain side select transistor SDTr and the source side select transistor SSTr are provided for determining selection/non-selection of the memory string MS. The memory strings MS are arranged along a staking direction, which is the lengthwise direction thereof.

Figure 3:
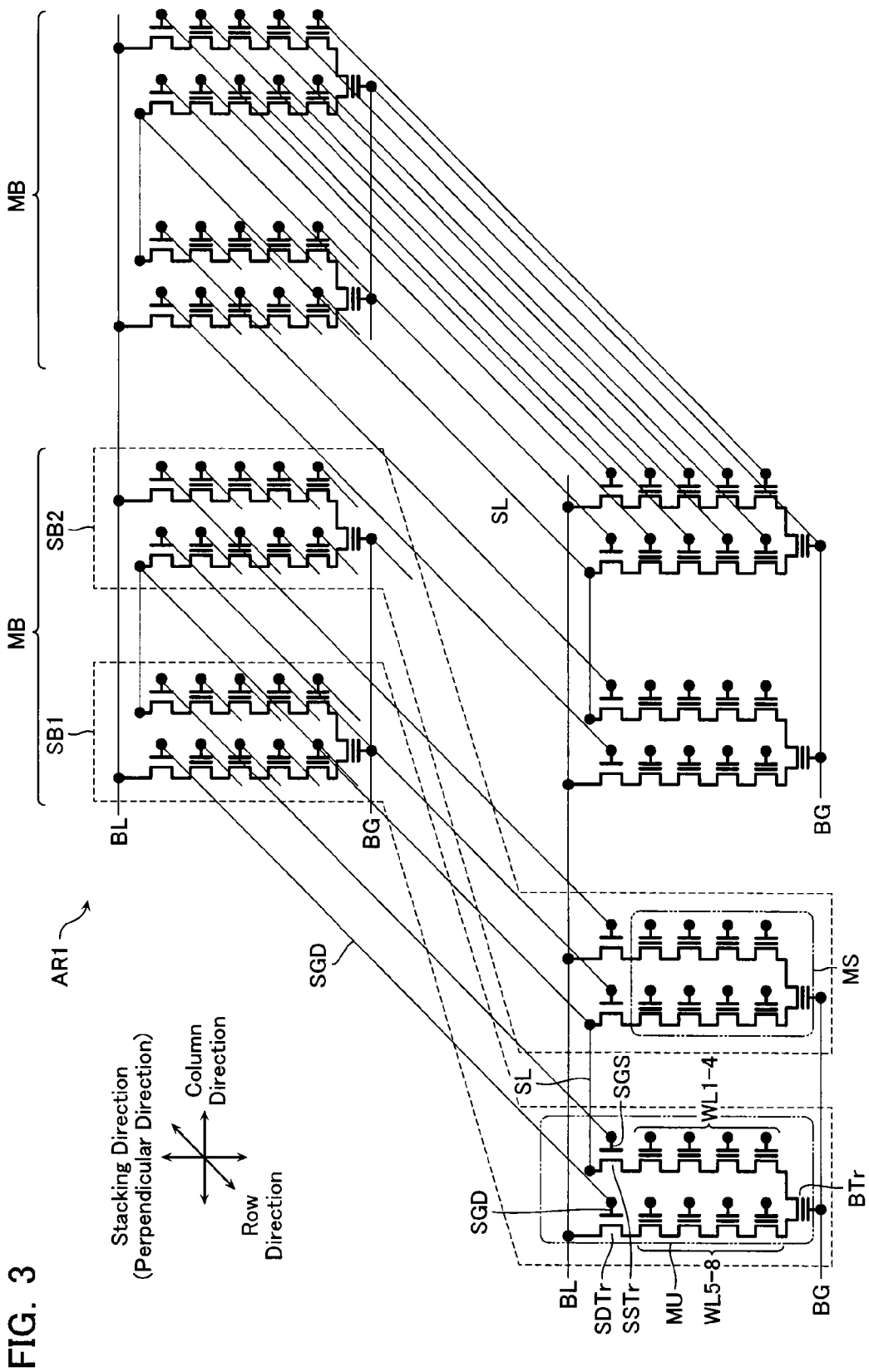
FIG. 3 is an equivalent circuit diagram showing a circuitry structure of the memory cell array AR1 of FIG. 1.

Referring now to FIG. 3, a circuit structure of the memory cell array AR1 is described in detail. The memory cell array AR1 has a plurality of memory blocks MB. The bit lines BL are arranged in a certain pitch along the row direction, and extends along the column direction, which is the lengthwise direction thereof. The memory blocks MB are repeatedly provided along the column direction.

The memory blocks MB have a plurality of memory units MU arranged in matrix in both the row direction and the column direction. The memory unit MU has the memory string MS, the source side select transistor SSTr and the drain side select transistor SDTr. The memory units MU are arranged in matrix in both the row direction and the column direction in the memory block MB.

The memory string MS has the memory cells MTr1-8 and the back gate transistor BTr. The threshold voltages of the memory cells MTr1-8 may change when the amount of charges stored in their charge storing layers changes. As a result of change in amount of charges, data held in the memory cells MTr1-8 changes.

The back gate transistor BTr is connected between the memory cell MTr4 and the memory cell MTr5 in the lowest layer. Thus, the memory cells MTr1-MTr8 and the back gate transistor BTr are connected in a U shape in a section along the column direction.

The gates of the n×2 memory cells MTr1 in one memory block MB are commonly connected to one word-line WL1 extending in the row direction. Similarly, the gates of the n×2 memory cells MTr2 to MTr8 are commonly connected to the respective word-lines WL2 to 8 extending in the row direction. The gates of the n×2 back gate transistors BTr arranged in matrix in the row direction and the column direction are commonly connected to the back gate line BG.

The gates of the n source-side select transistors SSTr aligned in the row direction are commonly connected to one source-side select gate line SGS extending in the row direction. The source-side select transistor SSTr has a source connected to a source-line SL extending in the row direction.

The gates of the n drain-side select transistors SDTr aligned in the row direction are commonly connected to one drain-side select gate line SGD extending in the row direction. The drain-side select transistor SDTr has a drain connected to a bit-line BL extending in the column direction.

Figure 4:
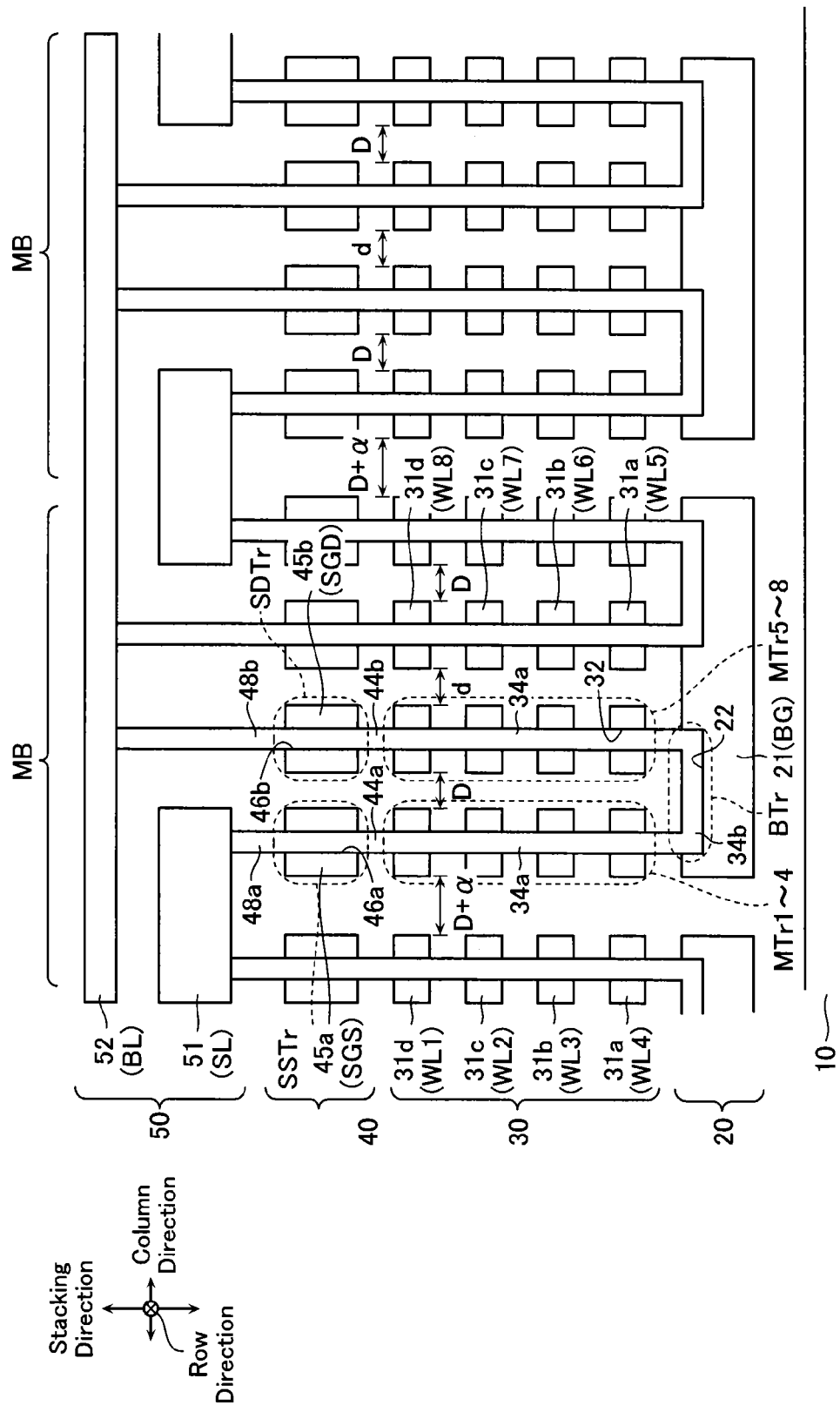
FIG. 4 is a schematic cross-sectional view of memory blocks MB in the memory cell array AR1 of FIG. 1.
Figure 5:
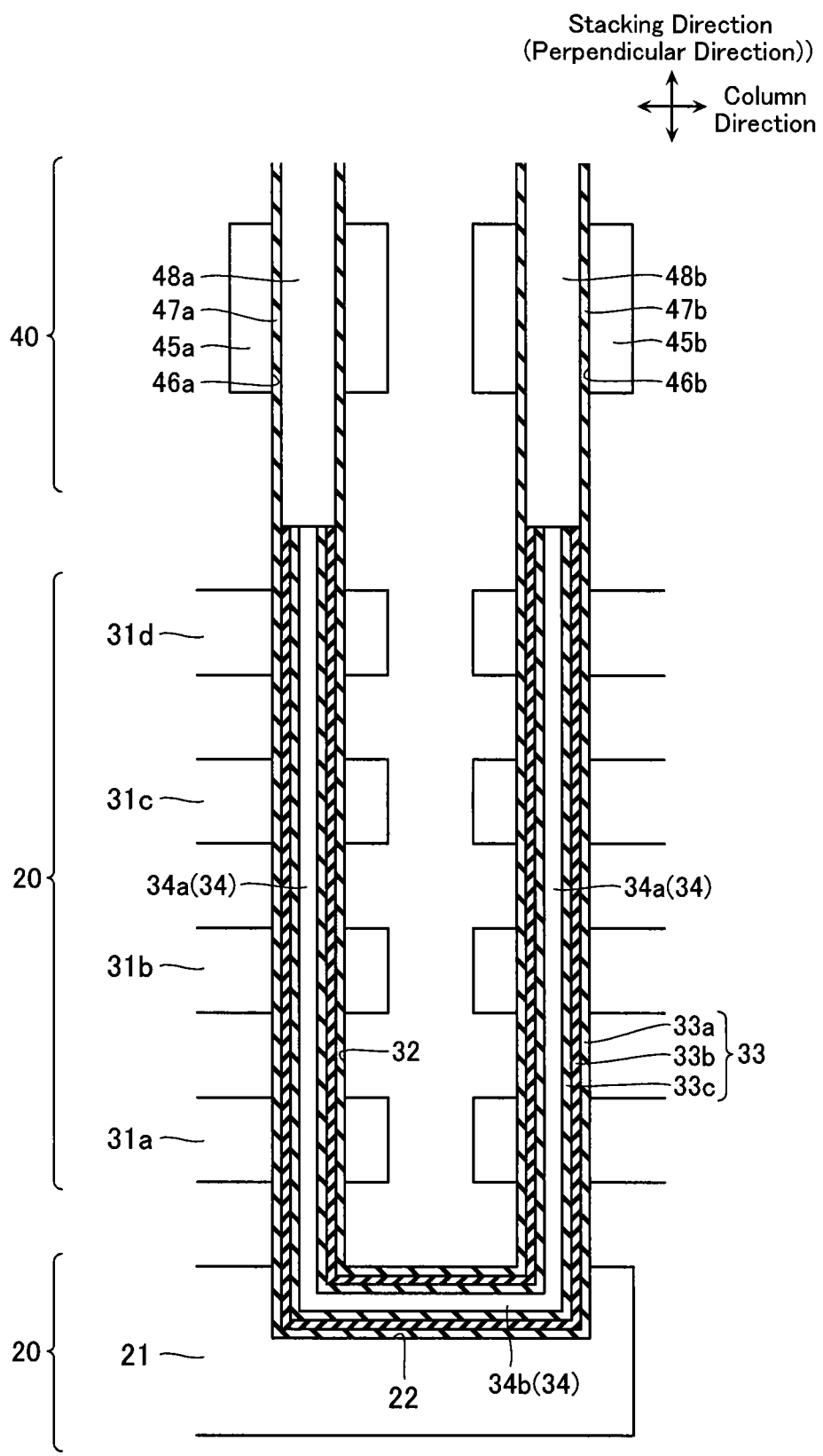
FIG. 5 is a schematic cross-sectional view of the memory unit MU in one memory blocks MB.
Figure 6:
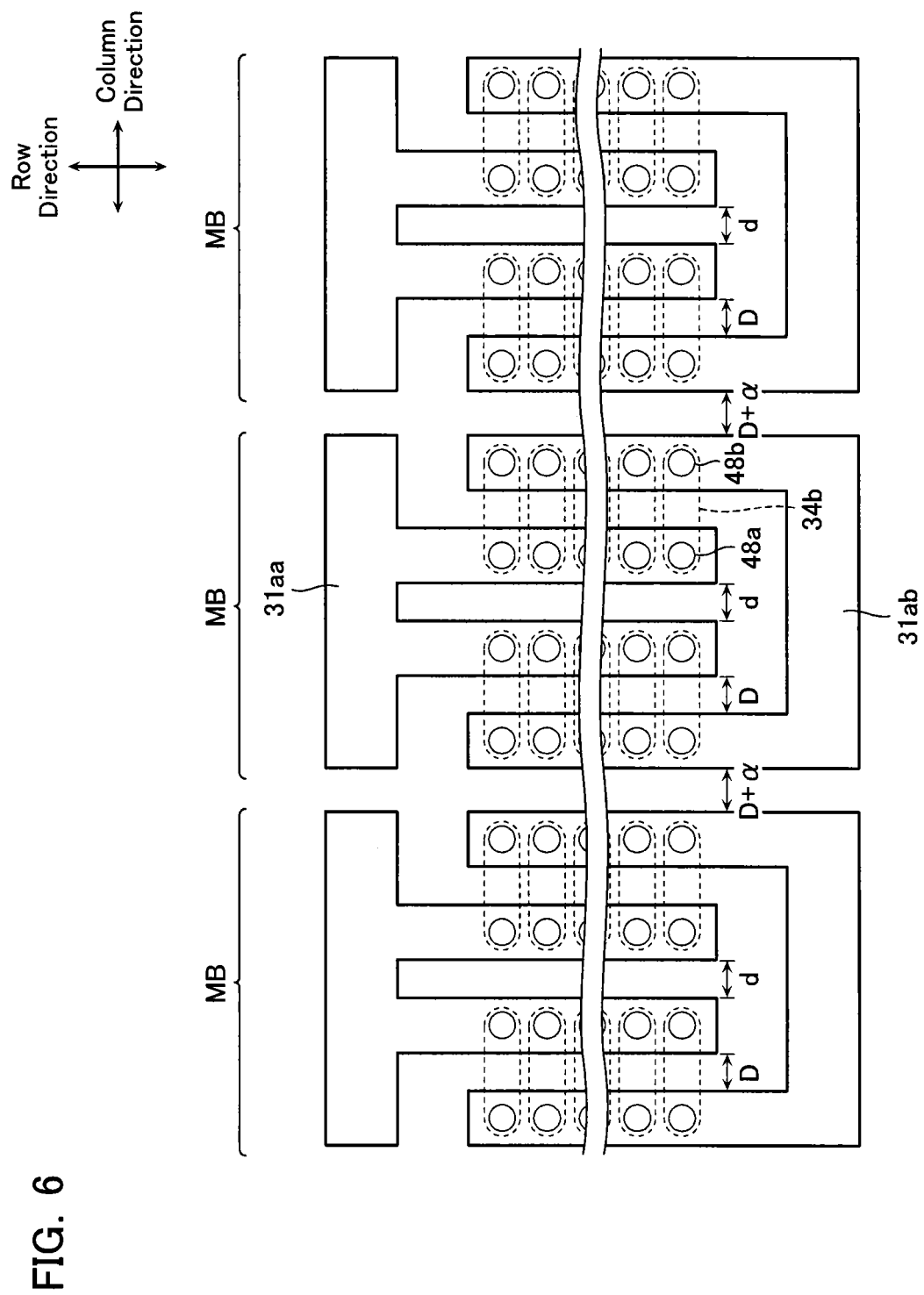
FIG. 6 is a plan view of one memory block MB.

Next, with reference to FIG. 4, FIG. 5 and FIG. 6, the laminate structure of the nonvolatile semiconductor memory device according to the first embodiment is described.

The memory cell array AR1 comprises on the substrate 10 a back gate transistor layer 20, a memory cell layer 30, a select transistor layer 40 and a wiring layer 50, as shown in FIG. 4.

The back gate transistor layer 20 functions as the back gate transistor BTr. The memory cell layer 30 functions as the memory cells MTr1-8 (memory strings MS). The select transistor layer 40 functions as the source side select transistor SSTr and the drain side select transistor SDTr. The wiring layer 50 functions as the source line SL and the bit line BL.

The back gate transistor layer 20 has a back gate conductive layer 21. The back gate conductive layer 21 functions as the back gate line BG, and functions as a gate of the back gate transistor BTr. The back gate conductive layer 21 is formed to spread two-dimensionally along a row direction and a column direction that are parallel to the substrate 10. The back gate conductive layer 21 is divided for respective memory blocks MB. The material of the back gate conductive layer 21 is polysilicon (poly-Si), for example.

The back gate conductive layer 20 has a back gate semiconductor layer 34b (a joining portion 34b) as shown in FIG. 4. The back gate semiconductor layer 34b is embedded in a back gate hole 22. The back gate hole 22 is formed to dig the back gate conductive layer 20. The back gate holes 22 are each formed substantially in a rectangle shape with its longitudinal direction along the column direction when seen from the top surface.
The back gate holes 22 are formed in matrix along the row direction and the column direction.

The memory cell layer 30 is formed in an upper layer of the back gate conductive layer 20. The memory cell layer 30 includes word-line conductive layers 31a to 31h. The word-line conductive layers 31a to 31h function as the word-lines WL1 to WL8 as well as the gates of the memory cells MTr1 to MTr8.

The word-line conductive layers 31a to 31d are laminated with interlayer insulating layers (not shown) sandwiched therebetween. The word-line conductive layer 31a to 31d are formed at a certain pitch in the column direction and extends in the row direction as the longitudinal direction. The word-line conductive layers 31a to 31d are formed of polysilicon (poly-Si).

Here, the distances along the column direction of the word-line conductive layers 31a-31d are set to have the following relationship. A distance between the word-line conductive layers 31a-31d of the one memory string MS is set to a distance D. On the other hand, a distance between the word-line conductive layers 31a-31d of one memory string MS and the word-line conductive layers 31a-31d of the other memory string MS adjacent to the former in the same block is set to a distance d, which is shorter than the distance D. Furthermore, a distance between the word-line conductive layers 31a-31d of one memory string MS in one block and the word-line conductive layers 31a-31d of the other memory string MS in the adjacent block is set to a distance D+α, which is longer than the distance D. This relationship is adopted for the following reason. That is, even if short-circuit occurs between the word lines WL of the adjacent two memory strings, a desired operation can be performed by controlling the select transistor SDTr and SSTr. However, when any two of the word lines WL1-8 in one memory string MS are short-circuited to each other, a memory block including the memory string MS becomes a defective block as a whole.

The memory cell layer 30 includes a memory semiconductor layer 34. The memory semiconductor layer 34 is embedded in a memory hole 32. The memory hole 32 is formed passing through the word-line conductive layers 31a to 31d and not-shown interlayer insulating layers. The memory hole 32 is formed aligning with the vicinity of the end portion of the back gate hole 22 in the column direction.

Further, with reference to FIG. 4 and FIG. 5, the back gate transistor layer 20 and the memory cell layer 30 include a memory gate insulating layer 33 and a memory semiconductor layer 34. The memory semiconductor layer 34 functions as the bodies of the memory cells MTr0 to MTr8 (the memory string MS).

With reference to FIG. 5, the memory gate insulating layer 33 is formed on the side of the back gate hole 22 and the memory hole 32 with a certain thickness. The memory gate insulating layer 33 includes a block insulating layer 33a, a charge accumulation layer 33b, and a tunnel insulating layer 33c.

With reference to FIG. 5A, the block insulating layer 33a is formed on the side of the back gate hole 22 and the memory hole 32 with a certain thickness. The charge accumulation layer 33b is formed on the side of the block insulating layer 33a with a certain thickness. The tunnel insulating layer 33c is formed on the side of the charge accumulation layer 33b with a certain thickness. The block insulating layer 33a and the tunnel insulating layer 33c are formed of silicon dioxide ($SiO_2$). The charge accumulation layer 33b is formed of silicon nitride (SiN).

The memory semiconductor layer 34 is formed in contact with the side of the tunnel insulating layer 33c. The memory semiconductor layer 34 is formed to fill in the back gate hole 22 and the memory hole 33. The memory semiconductor layer 34 is formed in a U shape when viewed in the row direction. The memory semiconductor layer 34 includes a pair of columnar portions 34a extending in the vertical direction with respect to the substrate 10, and a joining portion 34b coupling the lower ends of the pair of the columnar portions 34a. The memory semiconductor layer 34 is formed of polysilicon (poly-Si).

The back gate transistor layer 20 has, in other words, a configuration in which the memory gate insulating layer 33 is formed surrounding the joining portion 34b. The back gate conductive layer 21 is formed surrounding the joining portion 34b via the memory gate insulating layer 33. Further, the memory cell layer 30 has, in other words, a configuration in which the memory gate insulating layer 33 is formed surrounding the columnar portion 34a. The word-line conductive layers 31a to 31d are formed surrounding the columnar portion 34a via the memory gate insulating layer 33.

With reference to FIG. 5, the select transistor layer 40 includes a source-side conductive layer 45a and a drain-side conductive layer 45b. The source-side conductive layer 45a functions as the source-side select gate line SGS as well as the gate of the source-side select transistor SSTr. The drain-side conductive layer 45b functions as the drain-side select gate line SGD as well as the gate of the drain-side select transistor SDTr.

The source-side conductive layer 45a is formed in the periphery of the semiconductor layer 48a. The drain-side conductive layer 45b is in the same layer as the source-side conductive layer 45a and is also formed in the periphery of the semiconductor layer 48b. The source-side conductive layer 45a and the drain-side conductive layer 45b are formed of polysilicon (poly-Si).

With reference to FIG. 4, the select transistor layer 40 includes a source-side hole 46a and a drain-side hole 46b. The source-side hole 46a is formed passing through the source-side conductive layer 45a. The drain-side hole 46b is formed passing through the drain-side conductive layer 45b. The source-side hole 46a and drain-side hole 46b are each formed at a position aligning with the memory hole 32.

With reference to the FIG. 5, the select transistor layer 40 includes a source-side gate insulating layer 47a, a source-side columnar semiconductor layer 48*a*, a drain-side gate insulating layer 47*b*, and a drain-side columnar semiconductor layer 48*b*. The source-side columnar semiconductor layer 48*a* functions as the body of the source-side select transistor SSTr. The drain-side columnar semiconductor layer 48*b* functions as the body of the drain-side select transistor SDTr.

With reference to FIG. 4, the interconnection layer 50 is formed on the top layer of the select transistor layer 40. The interconnection layer 50 includes a source-line layer 51 and a bit-line layer 52. The source-line layer 51 functions as the source-line SL. The bit-line layer 52 functions as the bit-line BL.

The source-line layer 51 is formed in a plate extending in the row direction. The source-line layer 51 is formed in contact with the top surfaces of the pair of source-side columnar semiconductor layers 48*a* formed adjacent in the column direction. The bit-line layer 52 is contact with the upper surface of the drain-side columnar semiconductor layer 48*b*. The bit-line layer 52 is formed in a stripe arranged in the row direction at a certain pitch and is extending in the column direction. The source-line layer 51 and the bit-line layer 52 are formed of metal such as tungsten (W), copper (Cu), and aluminum (Al).

Referring now to FIG. 6, the shapes of the word-line conductive layers 31*a* to 31*d* will be described in more detail. FIG. 6 is a top view of the word-line conductive layers 31*a* to 31*d*. In FIG. 6, the planar shape of the word-line conductive layer 31*a* in the lowest layer is shown as one example. Since the other word-line conductive layers 31*b*-31*d* have substantially the same shapes, duplicate explanation thereof will be omitted.

With reference to FIG. 6, the word-line conductive layers 31*a* comprises a pair of conductive layers 31*aa* and 31*ab* formed in a comb shape. The pair of the conductive layers 31*aa* and 31*ab* face each other such that the comb portions thereof are in meshing engagement to each other. In addition, the word-line conductive layers 31*a* is divided in a block basis. The conductive layer 31*aa* serves as the word line WL5, while the conductive layer 31*ab* serves as the word line WL4.

Next, the erase operation in the non-volatile semiconductor memory device according to the first embodiment is described with reference to FIG. 7. When data erase operation is performed at once in a plurality of memory cells (a block basis, or a subblock basis) in such a lamination-type non-volatile semiconductor memory device, there exist memory cells in which data erase is accomplished quickly, while there exist memory cells in which it takes a long time to complete data erase. According to the erase operation of this embodiment, variation in speed of the erase operation may be suppressed.

The erase operation in the non-volatile semiconductor memory device of the laminating type according to the first embodiment is performed by providing a voltage around 20 V to the memory semiconductor layer 34, while providing to the word lines WL a voltage smaller than the voltage of the memory semiconductor layer 34 by about 20 V such as a ground voltage (0 V). This operation releases electrons charged in the charge accumulation film 33*b* to the memory semiconductor layer 34, and a threshold voltage of the memory cell MTr falls, and the erase of data is thereby performed.

Usually, in a non-volatile semiconductor memory device such as the first embodiment, a voltage of the memory semiconductor layer 34 is raised by generating a GIDL current (a Gate Induced Drain Leakage Current) at a gate edge of the drain side select transistor SDTr or the source side select transistor SSTr. Positive holes caused by the GIDL current flow into the memory semiconductor layer 34. As a result, a potential of the memory semiconductor layer 34 rises.

In order to generate a GIDL current at the drain side select transistor SDTr, a voltage $V_{ERA}$ around 20 V is applied to the bit line BL, and a voltage $V_{ERA}$-$\beta$ (around 12-15 V) that is smaller than the voltage $V_{ERA}$ by a certain value $\beta$ to the drain side selection gate line SGD, for example. Likewise, in order to generate a GIDL current at the source side select transistor SSTr, a voltage $V_{ERA}$ around 20 V is applied to the source line SL, and a voltage $V_{ERA}$-$\beta$ (around 12-15 V) to the source side selection gate line SGS, for example.

However, variation in hole concentration Q in the memory semiconductor layer 34 may arise when the voltage of the memory semiconductor layer 34 is raised based on such a GIDL current. This is because, for example, positive holes flow from the drain side select transistor SDTr located at an end of the memory unit MU or the source side select transistor SSTr. That is, as a memory cell MTr is more distant from the drain side select transistor SDTr or the source side select transistor SSTr, less positive holes flow into the memory cell MTr. As a result, a voltage of the memory semiconductor layer 34 may not become uniform as a whole.

Figure 7A:
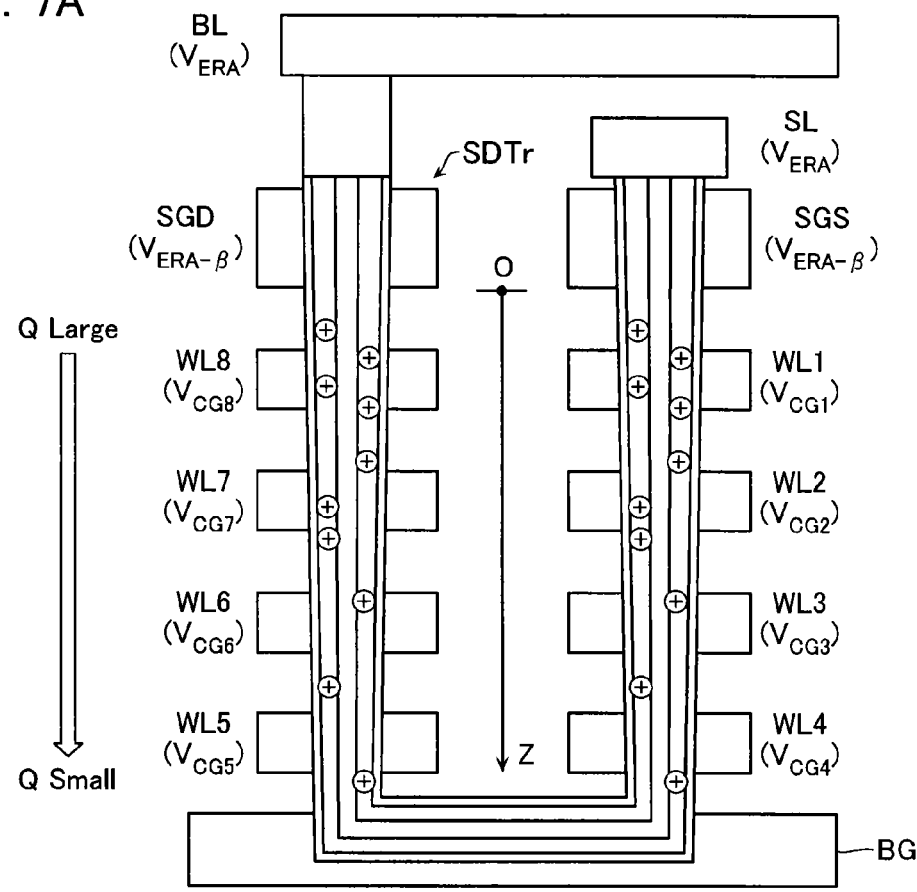
FIG. 7A is a conceptional diagram showing an operation of the non-volatile semiconductor memory device according to the first embodiment.
Figure 7B:
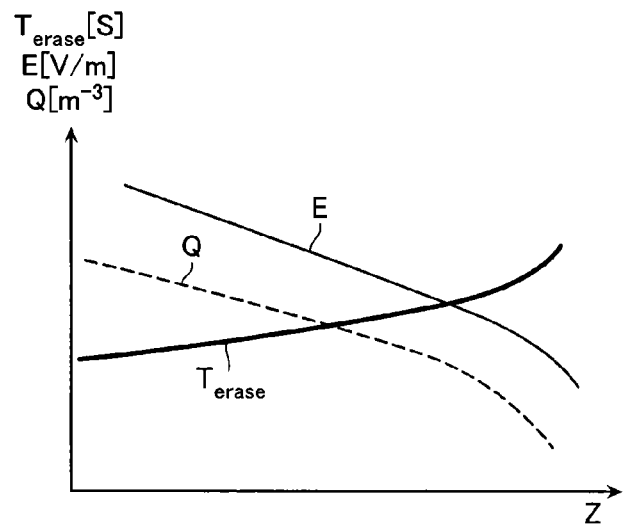
FIG. 7B is a conceptional diagram showing an operation of the non-volatile semiconductor memory device according to the first embodiment.

Specifically, FIGS. 7A and 7B assume a case that hole concentration Q in the memory semiconductor layer 34 becomes larger as a position thereof is closer to the drain side select transistor SDTr as a generation source of a GIDL current.

When the same voltage (e.g., a ground voltage Vss) is applied to all of the word lines WL1-WL8 under a condition where variation in hole concentration Q is generated, an electric field E generated between the memory semiconductor layer 34 and the word line WL becomes larger at the upper side of the memory semiconductor layer 34, while becoming smaller at the lower side thereof, as shown in a graph (E) of FIG. 7B. When such variation in electric field E occurs, there arises variation in erase time $T_{erase}$ of the memory cells MTr in one memory string MS (see a graph of FIG. 7B). Therefore, this embodiment sets voltages to be applied to the word lines WL1-8 in the erase operation at different values, to deal with variation in hole concentration Q. Specifically, in a condition as shown in FIG. 7A, the largest voltages $V_{CG1}$ and $V_{CG8}$ are provided respectively to the word lines WL1 and WL8 connected to the memory cells MTr1 and MTr8 adjacent to the drain side select transistor SDTr and the source side select transistor SSTr.

On the other hand, word lines WL under the word lines WL1 and WL8 are provided with voltages which become lower as being distant from the drain side select transistor SDTr or the source side select transistor SSTr. That is, voltages $V_{CG2}$ (<$V_{CG1}$) and $V_{CG7}$ (<$V_{CG8}$) are applied to the word lines WL2 and WL7, respectively. Voltages $V_{CG3}$ (<$V_{CG2}$) and $V_{CG6}$ (<$V_{CG7}$) are applied to the word line WL3 and WL6, respectively. Voltages $V_{CG4}$ (<$V_{CG3}$) and $V_{CG5}$ (<$V_{CG6}$) are applied to the word lines WL4 and WL5, respectively.

As a result, influence of the variation in hole concentration Q is reduced, and the erase time $T_{erase}$ in each of the memory cells MTr may be equalized. By equalizing the erase time $T_{erase}$, extra stress applied to a specific memory cell may be reduced, and the width of the threshold voltage distribution after the erase operation may be narrowed.

Modification of First Embodiment

Figure 7C:
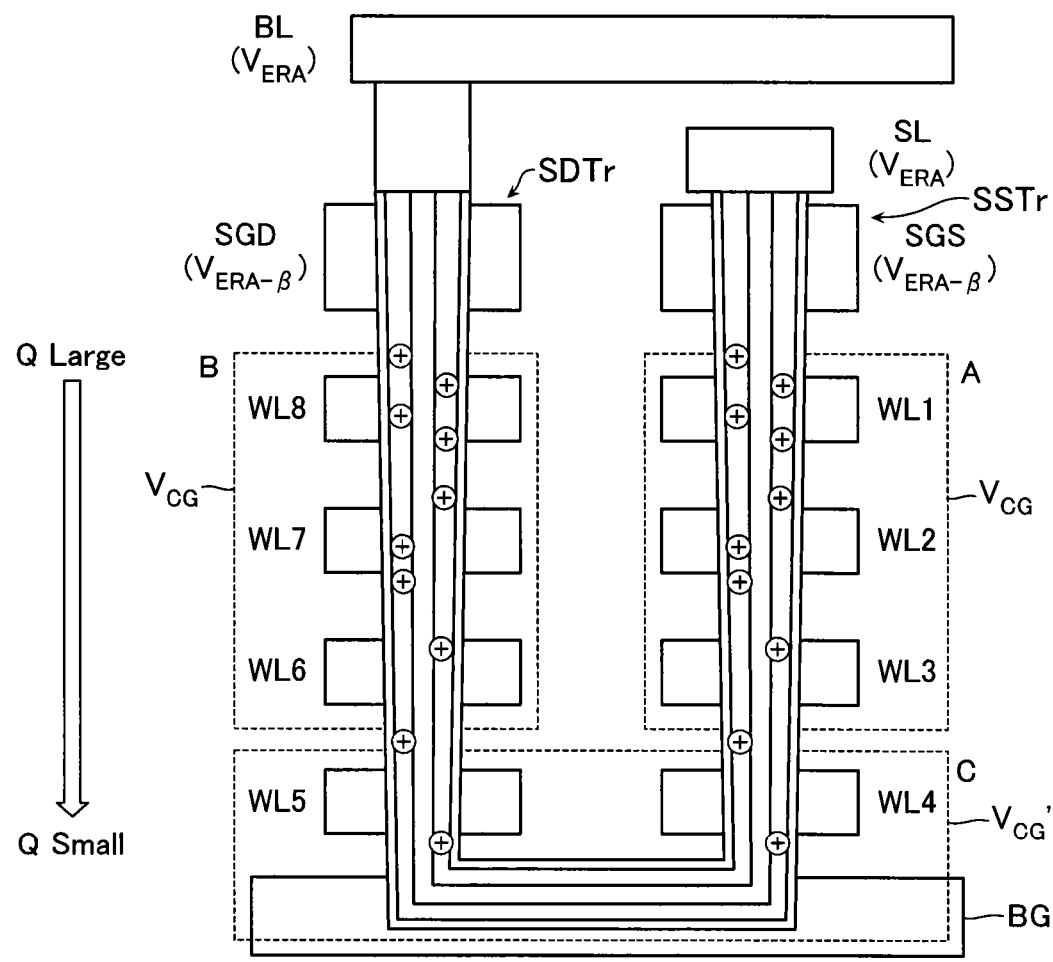
FIG. 7C is a conceptional diagram showing an operation of the non-volatile semiconductor memory device according to a modification of the first embodiment.

A modification of the first embodiment is shown in FIG. 7C. In the first embodiment, all of the voltages $V_{CG1}$-$V_{CG8}$ are set to different values, depending on the distance from the drain side select transistor SDTr or the source side select transistor SSTr. On the other hand, in the modification of the first embodiment, a plurality of word lines WL1-8 connected to one memory string MS is classified into a plurality of groups as shown in FIG. 7C. For example, the word lines WL1-3 are classified into group A, the word lines WL6-8 into group B, and the word lines WL4-5 into group C. Then, the control circuit AR2 provides the different voltages to the plural groups, respectively. The plural word lines WL in the same group are provided with the same voltage. For example, Group A, B, C are provided with voltages $V_{CG}$, $V_{CG}$, $V_{CG}'$ ($<V_{CG}$), respectively.

According to the modification of the first embodiment, the number of types of the voltages to be provided may be reduced compared to FIG. 7A.

Thus, a structure of the control circuit AR2 may be simplified as compared to that of the first embodiment, and a circuit area thereof can be smaller.

A way of the grouping is not limited to the above-mentioned one. For example, the word lines WL1-2 may be classified into group A, the word lines WL7-8 into Group B, and the word lines WL3-6 into group C.

Second Embodiment

Next, a non-volatile semiconductor memory device according to second embodiment is described with reference to FIG. 8. Since the structure of the non-volatile semiconductor memory device according to the second embodiment is similar to those shown in FIG. 1-FIG. 6, the explanation thereof is omitted here. In this embodiment, in order to deal with the same problem as that of the first embodiment, a voltage control by the control circuit AR2 is performed such that a time period T for applying a certain voltage $V_{CG}$ is different among the word lines WL1-8. Note that the first embodiment and the second embodiment may be combined. That is, it is possible that time periods for applying a voltage may be different among word lines WL1-8, and a voltage value of the applied voltages may be different among the word lines WL1-8 at the same time.

Next, the operation of the second embodiment is described with reference to FIG. 8. The second embodiment also assumes a case in which the hole concentration Q in the memory semiconductor layer 34 becomes larger as it comes closer to the drain side select transistor SDTr or the source side select transistor SSTr as a generation origin of the GIDL current, and the hole concentration Q in the memory semiconductor layer 34 becomes smaller as it comes further from the drain side select transistor SDTr or the source side select transistor SSTr. In this second embodiment, control by the control circuit AR2 is performed such that time periods T during which a voltage $V_{CG}$ is applied are different among the word lines WL1-8 in an erase operation, in order to reduce variation in erase time due to variation in hole concentration Q.

Figure 8:
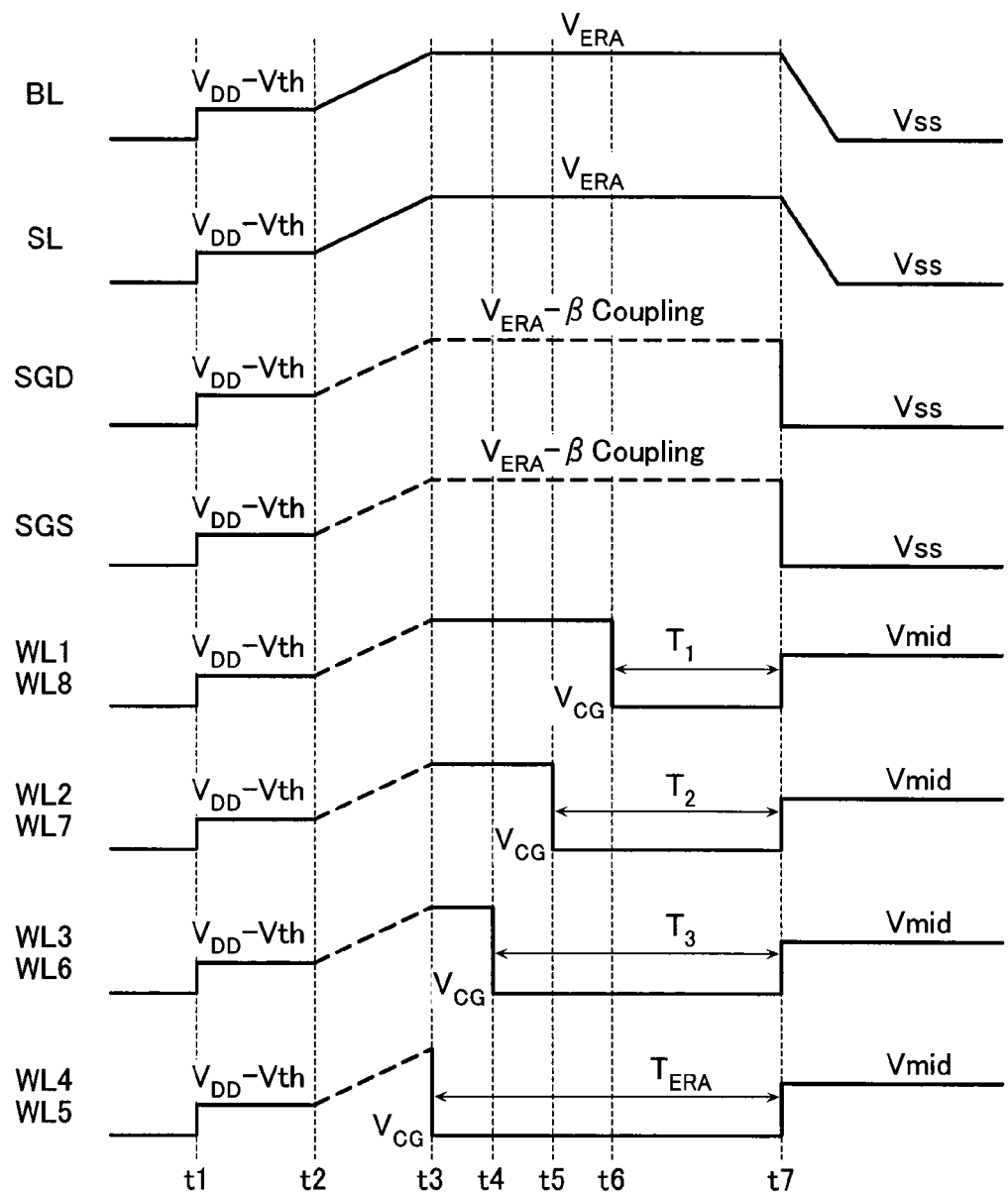
FIG. 8 is a timing chart showing an operation of the non-volatile semiconductor memory device according to the second embodiment.

A specific operation of the erase operation is described using a timing-chart of FIG. 8. First, all of the bit line BL, the source line SL, the selection gate lines SGD, SGS and the word line WL1-8 are charged up to a voltage of $V_{DD}$-Vth at time t1 ($V_{DD}$ denotes a power supply voltage, and Vth denotes a threshold voltage of the transfer transistor (not shown)).

Thereafter, the selection gate lines SGD, SGS and word lines WL are brought to a floating state by cutting off the transfer transistors (not shown). Then, the voltage of the bit line BL and the source line SL is raised from a voltage $V_{DD}$-Vth to a voltage $V_{ERA}$ at time t2. This causes the potential of the selection gate lines SGD, SGS and the word lines WL to further rise by capacitive coupling. The voltages of the selection gate lines SGD and SGS rise to a voltage $V_{ERA}$-β that is enough for generating a GIDL current Subsequently, in a time period that is not before time t3, the voltages of the word lines WL1-8 drop to a voltage $V_{CG}$ sequentially, although the timings of the drop of the voltage in the word lines WL-8 are different to one another.

Specifically, the word lines WL1 and WL8 connected to the memory cells MTr1 and MTr8 are applied with a voltage $V_{CG}$ between time t6 and t7 (a time period of $T_1$). The word lines WL2 and WL7 are applied with the voltage $V_{CG}$ between time t5 and t7 (a time period of $T_2$). The time period $T_2$ is longer than the time period $T_1$. Also, the word lines WL3 and WL6 are applied with the voltage $V_{CG}$ between time t4 and t7 (a time period of $T_3$). The time period $T_3$ is longer than the time period $T_2$. The word lines WL4 and WL5 are applied with the voltage $V_{CG}$ between time t3 and t7 (a time period of $T_{ERA}$). The time period $T_{ERA}$ is longer than the time period $T_3$.

In this way, depending on a position of the word line WL in the z direction, a time period of applying the voltage $V_{CG}$ may be changed, thereby obtaining the same advantage as that of the first embodiment.

Figure 9:
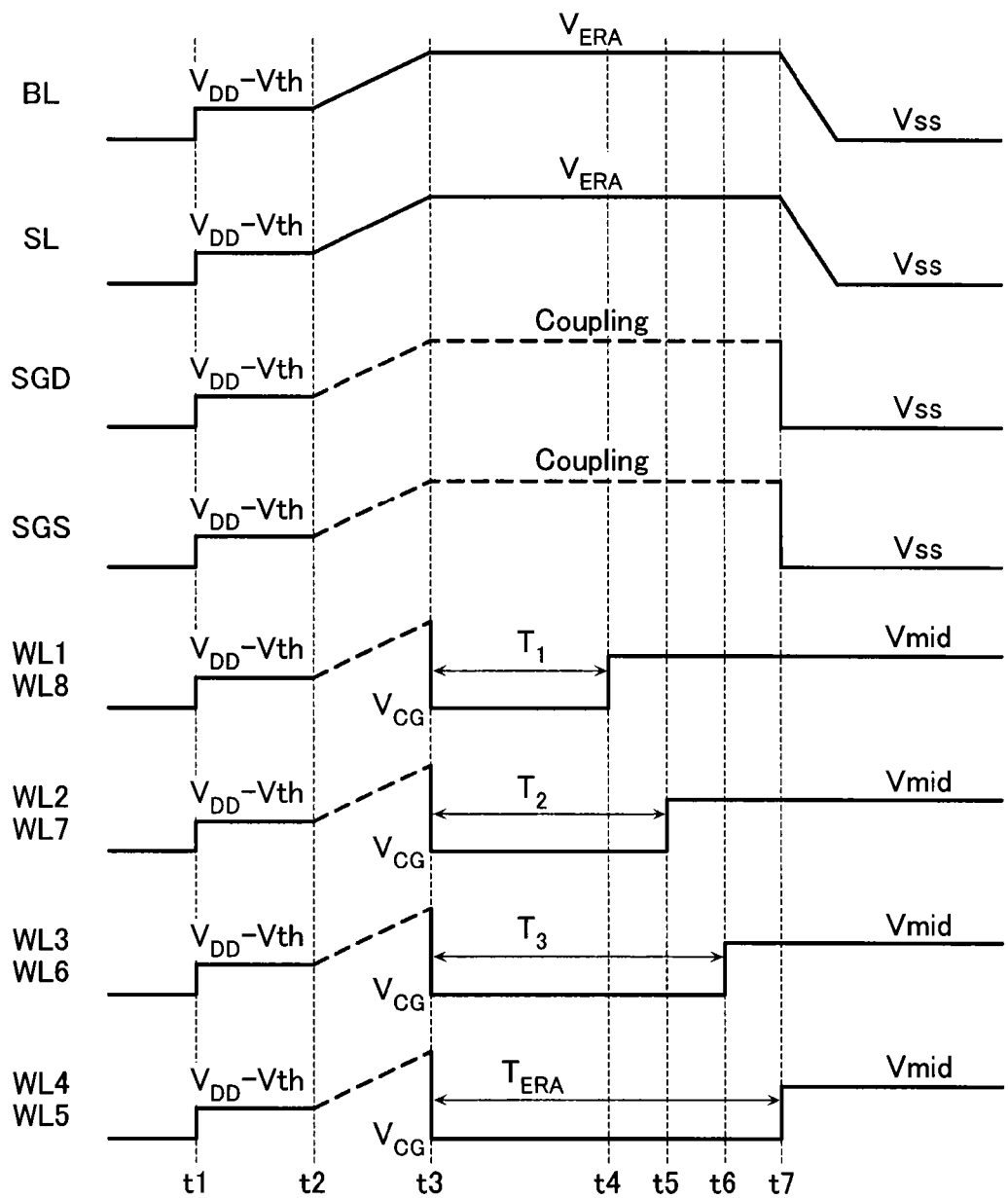
FIG. 9 is a timing chart showing an operation of the non-volatile semiconductor memory device according to a modification of the second embodiment.

A modification of the second embodiment is described below. In the second embodiment, an example has been explained in which voltages of all of the word lines WL1-8 fall to the voltage $V_{CG}$ at different timings (time t3 to t6), and, rise at the same time at time t7 to the voltage $V_{mid}$. As shown in FIG. 9, in the modification of the second embodiment, the word lines WL1-8 starts to be applied with the voltage $V_{CG}$ at the same timing at time t3. The timings when application of the voltage $V_{CG}$ is finished are different among the word lines WL. This operation may provide the same advantage as that of the second embodiment.

Third Embodiment

Next, a non-volatile semiconductor memory device according to the third embodiment is described with reference to FIG. 10A, FIG. 10B, FIG. 10C. Since the structure of the non-volatile semiconductor memory device according to the third embodiment is similar to those shown in FIG. 1-FIG. 6, the explanation thereof is omitted here. The third embodiment is similar to the first embodiment in that it performs an erase operation by generating a GIDL current at the select transistors SDTr and SSTr.

However, while the first embodiment provides different voltages to the word lines WL in order to reduce influence of the variation in hole concentration Q caused by the GIDL current, the third embodiment provides different voltages to the word lines WL depending on variation in radius r of the memory semiconductor layer 34.

The memory semiconductor layer 34 generally has a tapered shape (the tapered shape used herein means a shape whose diameter changes in an up-and-down direction. For example, it includes a shape whose diameter thereof becomes smaller as it goes along a direction from an upper portion thereof to a lower position thereof, or a shape in which the diameter thereof becomes larger at the middle portion thereof).

Thus, when positive holes due to the GIDL current are distributed uniformly in the memory semiconductor layer 34, the memory cell that is located at a lower position (near the substrate 10) in the memory string MS tends to be erased easily compared to the memory cell that is located at a upper position. This may cause variation in erase time $T_{erase}$.

This embodiment is intended to cancel the variation in erase time $T_{erase}$ caused by the tapered shape of the memory semiconductor layer 34. It is noted that the third embodiment assumes that positive holes caused by the GIDL current are distributed substantially uniformly in the memory semiconductor layer 34, and there is no unevenness of the hole concentration Q in the memory semiconductor layer 34.

Figure 10A:
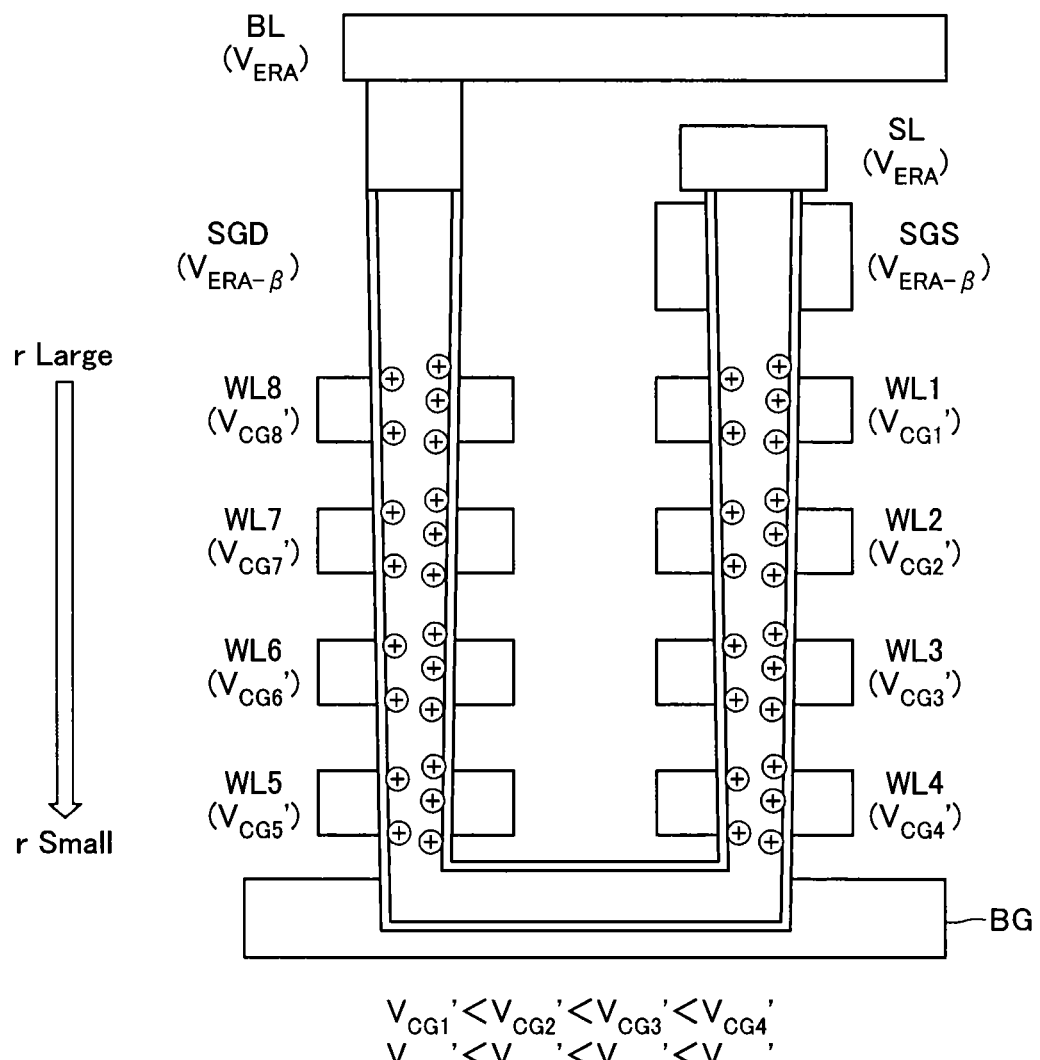
FIG. 10A is a conceptional diagram showing an operation of the non-volatile semiconductor memory device according to the third embodiment.
Figure 10B:
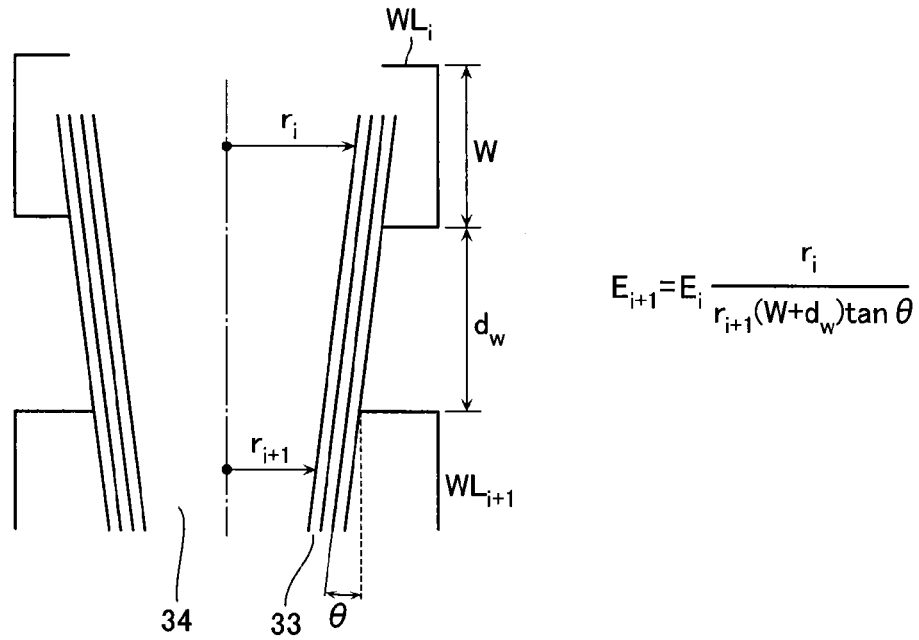
FIG. 10B is a conceptional diagram showing an operation of the non-volatile semiconductor memory device according to the third embodiment.
Figure 10C:
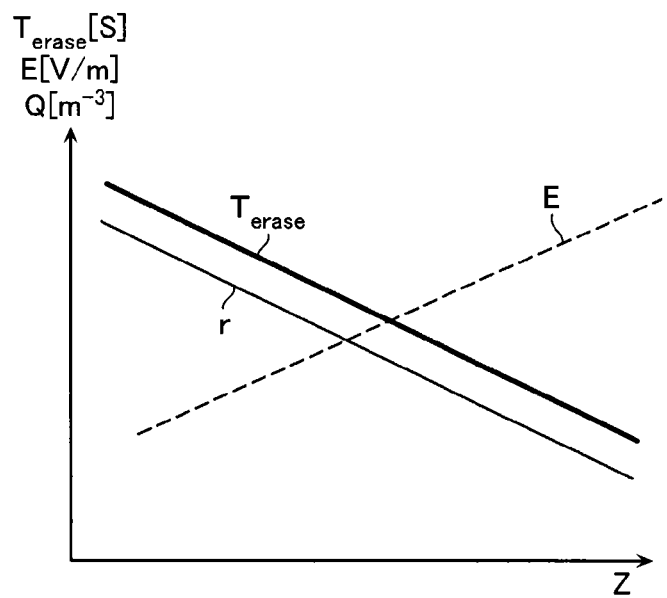
FIG. 10C shows an operation of the non-volatile semiconductor memory device according to the third embodiment.

Referring now to FIGS. 10B and 10C, variation in erase time $T_{erase}$ due to the tapered shape of the memory semiconductor layer 34 is described. As shown in FIG. 10B, it is assumed that an outer wall of the memory semiconductor layer 34 has an angle θ (a tapered shape) against the vertical direction, and a thickness of one word line WL is W, an interval between two adjoining word lines WL is dw.

It is assumed that a radius of the memory semiconductor layer 34 in a memory cell MTri connected to a word line WLi is ri. In this case, a radius $r_{i+1}$ of the memory semiconductor layer 34 in a memory cell $MTr_{i+1}$ connected to a word line $WL_{i+1}$ located below the word line WLi may be represented by the following equation 0.

$$r_{i+1}=ri-(W+d)\tan\theta. \quad\text{[Equation 0]}$$

It is assumed that hole concentration Q caused by a GIDL current is uniform in such the memory semiconductor layer 34 having a tapered shape, and the word lines WLi and $WL_{i+1}$ are applied with the same voltage. In this case, an electric field $E_i$ in the vicinity of the memory gate insulating film of the memory cell MTri is different in value from an electric field $E_{i+1}$ of the memory gate insulating film in the vicinity of the memory cell $MTr_{i+1}$. Specifically, the relationship between them is represented by the following formula.

$$E_{i+1}=E_i r_i/\{(r_{i+1}(W+dw)\tan\theta\}) \quad\text{[Equation 1]}$$

Thus, as shown in FIG. 10C, an electric field E becomes more intense in a memory cell at a lower part than in a memory cell in an upper part. As a result, the erase time $T_{erase}$ becomes shorter in a memory cell at a lower part, and becomes longer in a memory cell in an upper part.

Accordingly, this embodiment sets voltages applied to the word lines WL1-8 in an erase operation to the following, different values as shown in FIG. 10A. The uppermost word lines WL1 and WL8 in the memory string MS are provided with the smallest voltages $V_{CG1}'$, $V_{CG8}'$. On the other hand, the word lines WL located at lower parts than the word lines WL1 and WL8 are provided with larger voltages. The voltages applied thereto becomes larger as it goes downward. That is, the word lines WL2 and WL7 are supplied with a voltage $V_{CG2}'$ (>$V_{CG1}'$), and $V_{CG7}'$ (>$V_{CG8}'$), respectively. The word lines WL3 and WL6 are supplied with a voltage $V_{CG3}'$ (>$V_{CG2}'$) and $V_{CG6}'$ (>$V_{CG7}'$), respectively. The word lines WL4 and WL5 are supplied with a voltage $V_{CG4}'$ (>$V_{CG3}'$) and $V_{CG5}'$ (>$V_{CG6}'$), respectively. Applying such the different voltages to the word lines may suppress variation in erase time among the memory cells.

Figure 11:
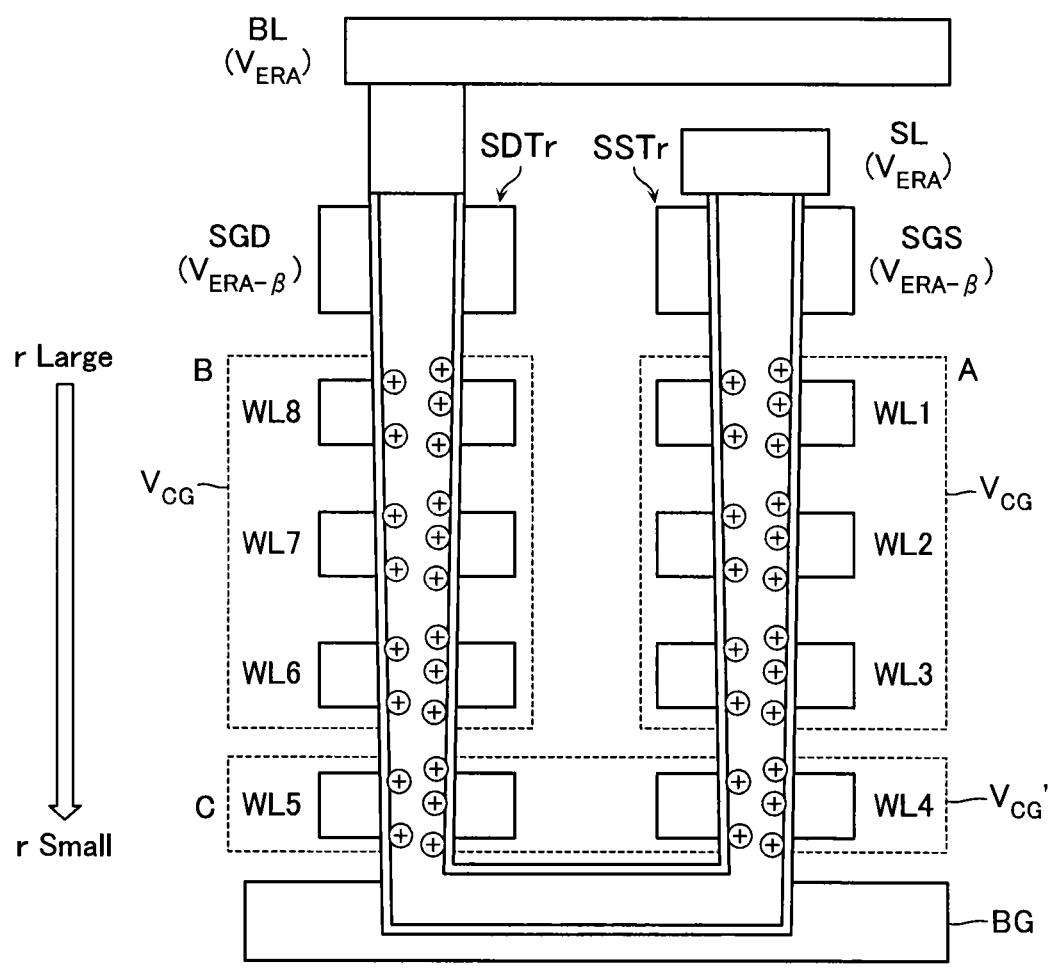
FIG. 11 shows an operation of the non-volatile semiconductor memory device according to a modification of the third embodiment.

A first modification of the third embodiment is described below with reference to FIG. 11. In the first modification of the third embodiment, a plurality of word lines WL1-8 connected to one memory string MS is classified into a plurality of groups, like the first modification of the first embodiment. For example, the word lines WL1-3 are classified into Group A, the word lines WL6-8 into Group B, and the word lines WL4-5 into Group C. Then, the control circuit AR2 supplies different voltages to the different groups, and supplies the same voltage to the plurality word lines WL in the same group. For example, the Groups A, B, and C are provided with voltages $V_{CG}$, $V_{CG}$, and $V_{CG}'$ (<$V_{CG}$) respectively.

In the first modification of the third embodiment, the number of types of voltages to be applied may be reduced in comparison with FIG. 10A. Thus, the structure of the control circuit AR2 may be simplified in comparison with that of the third embodiment, and a circuit area thereof may be smaller.

The way of grouping is not limited to the above-described example. For example, the word lines WL1-2 may be classified into Group A, the word lines WL7-8 into Group B, and the word lines WL3-6 into Group C.

Fourth Embodiment

Next, a non-volatile semiconductor memory device according to fourth embodiment is described with reference to FIG. 12. Since the structure of the non-volatile semiconductor memory device according to the fourth embodiment is similar to those shown in FIG. 1-FIG. 6, the explanation thereof is omitted here. In this fourth embodiment, voltage control by the control circuit AR2 is performed such that time periods T during which a predetermined voltage $V_{CG}$ is applied are made different among the word lines WL1-8, in order to reduce variation in the erase time $T_{erase}$ due to the tapered shape of the memory semiconductor layer 34. This is different from the third embodiment. Note that the third embodiment and the fourth embodiment may be combined. That is, it is possible that the time periods for applying a voltage among the word lines WL1-8 may differ to one another, and, at the same time, the voltage values of the applied voltages differ to one another.

Next, the operation of the fourth embodiment is described with reference to FIG. 12. The fourth embodiment also assumes that hole concentration Q in the memory semiconductor layer 34 is substantially equal as a whole.

In the fourth embodiment, control by the control circuit AR2 is performed such that time periods T during which a voltage $V_{CG}$ is applied to the word lines WL1-8 are different to one another in an erase operation, thereby reducing variation in erase time $T_{erase}$ due to a tapered shape of the memory semiconductor layer 34.

Figure 12:
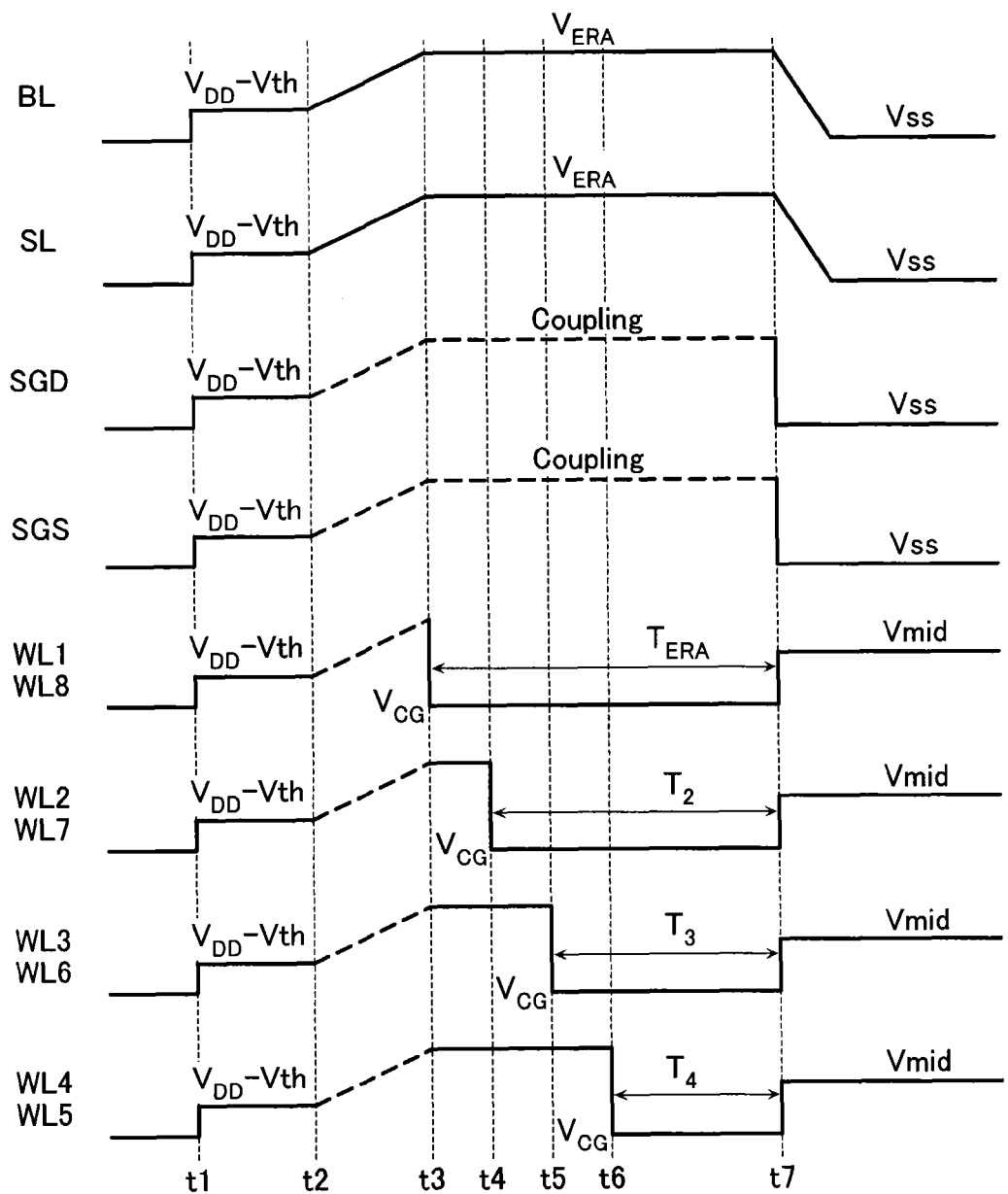
FIG. 12 is a timing chart showing an operation of the non-volatile semiconductor memory device according to the fourth embodiment.

A Specific operation in the erase operation is described using a timing chart of FIG. 12. First, the operation between time t1-t3 is similar to that of the second embodiment.

Thereafter, in a time period after time t3, the voltages of the word lines WL1-8 drop to the voltage $V_{CG}$. However, timings of the drop in voltage are different among the word lines WL. Specifically, the word lines WL1 and WL8 connected to the memory cells MTr1 and MTr8 are applied with the voltage $V_{CG}$ during a time period between time t3 and t7 (a time period of $T_{ERA}$). The word lines WL2 and WL7 are applied with the voltage $V_{CG}$ during a time period between time t4 and t7 (a time period of $T_2$). The time period $T_2$ is shorter than the time period $T_{ERA}$. The word lines WL3 and WL6 are applied with the voltage $V_{CG}$ during a time period between time t5 and t7 (a time period of $T_3$). The time period $T_3$ is shorter than the time period $T_2$. The word lines WL4 and WL5 are applied with the voltage $V_{CG}$ during a time period between time t6-t7 (a time period of $T_4$). The time period $T_4$ is shorter than the time period $T_3$.

As described above, time periods for applying the voltage $V_{CG}$ may be changed depending on a distance from the drain side select transistor SDTt or the source side select transistor SSTr. This operation may provide the same advantage as that of the third embodiment.

In an example illustrated in FIG. 12, the voltages of the word lines WL1-8 drop to the voltage $V_{CG}$ at timings different from one another, and then the voltages of the word lines WL1-8 rise to the voltage $V_{mid}$ at the same time at time t7. Instead of this, the voltages of the word lines WL1-8 may drop to the voltage $V_{CG}$ at the same time at time t3, for example, and then, the voltages of the word lines WL1-8 may rise to the voltage $V_{mid}$ at different timings (The more distant a word line WL of a memory cell MTr is from the drain side select transistor SDTr or the source side select transistor SSTr, the more earlier timing it returns to the voltage $V_{mid}$).

Fifth Embodiment

Next, a non-volatile semiconductor memory device according to the fifth embodiment is described with reference to FIG. 13A. Since the structure of the non-volatile semiconductor memory device according to the fifth embodiment is similar to those shown in FIG. 1-FIG. 6, the explanation thereof is omitted here. The fifth embodiment is similar to the above-mentioned embodiments in that an erase operation is performed by generating a GIDL current in the select transistors SDTr and SSTr.

The fifth embodiment is different from the above-mentioned embodiments in that voltages of the word lines WL1-8 are made different in consideration of both variation in hole concentration Q due to the GIDL current and variation due to the tapered shape of the memory semiconductor layer 34.

As described earlier, variation in hole concentration Q occurs in the memory semiconductor layer 34. This may cause variation in erase time $T_{erase}$ in plural memory cells MTr in one of the memory strings MS. Likewise, as described earlier, when the memory semiconductor layer 34 has a tapered shape, change in radius r of the memory semiconductor layer 34 may cause variation in erase time $T_{erase}$.

Figure 13A:
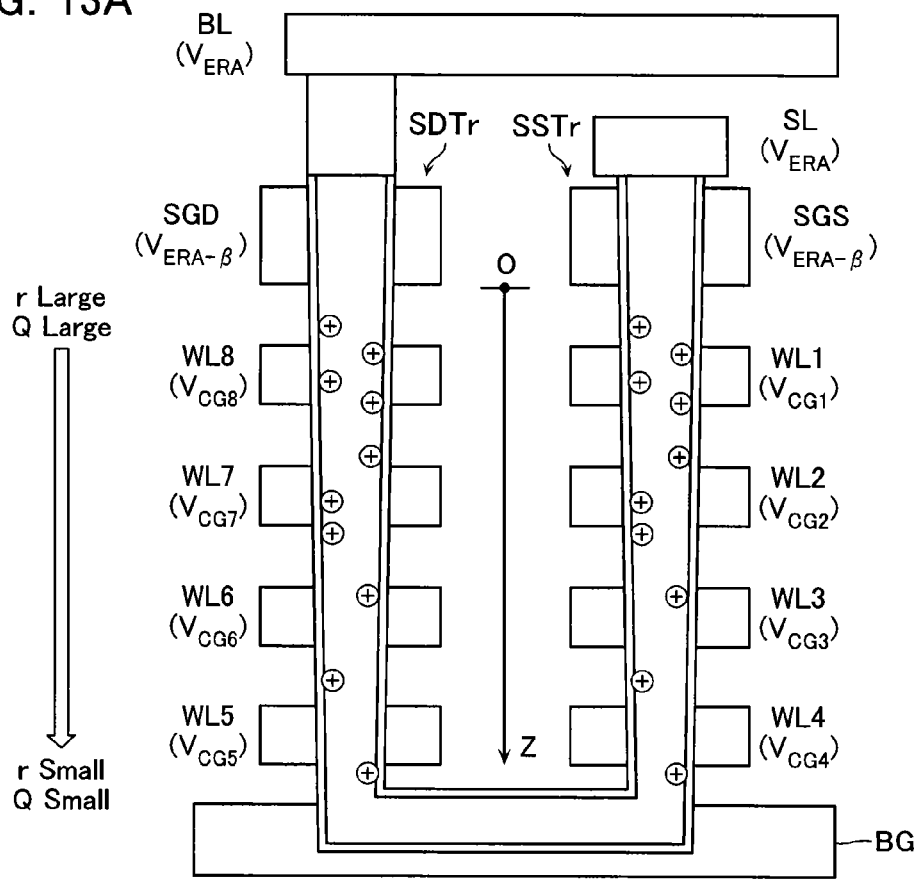
FIG. 13A is a conceptional diagram showing an operation of the non-volatile semiconductor memory device according to the fifth embodiment.
Figure 13B:
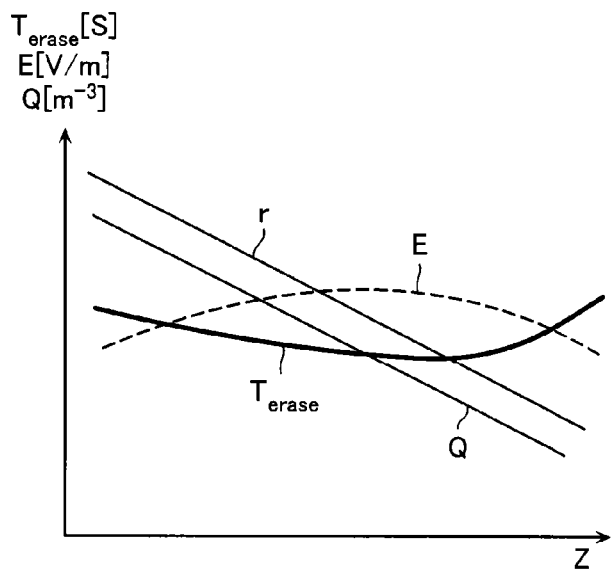
FIG. 13B is a conceptional diagram showing an operation of the non-volatile semiconductor memory device according to the fifth embodiment.

Variation in erase time $T_{erase}$ may be affected by both variation in hole concentration Q and change in radius r of the memory semiconductor layer 34, as shown in FIG. 13B. Variation in erase time $T_{erase}$ is caused by various factors such as an angle of the tapered shape, a material of the memory semiconductor layer 34, and others. As shown in FIG. 13B, a memory cell MTr connected to a word line WL in a middle layer (in FIG. 13A, a word line WL3) tends to have a shortest erase time $T_{erase}$. FIG. 13B shows a case in which the erase time $T_{erase}$ of the memory cells MTr3 and MTr6 connected to the word lines WL3 and WL6 is the shortest, and the erase time $T_{erase}$ becomes longer in the order of the word lines WL2 (WL7), WL4 (WL5), and WL1 (WL8), under the same condition.

Accordingly, in this embodiment, voltages to be applied to the word lines WL1-8 in the erase operation are set to the following different values, as shown in FIG. 13A. The largest voltages $V_{CG3}$ and $V_{CG6}$ are applied to the word lines WL3 and WL6 among all of the word lines WL1-8. The word lines WL2 and WL7 are applied with a voltage $V_{CG2}$ ($<V_{CG3}$) and a voltage $V_{CG7}$ ($<V_{CG6}$), respectively. The word lines WL4 and WL5 are applied with a voltage $V_{CG4}$ ($<V_{CG2}$), and a voltage $V_{CG5}$ ($<V_{CG7}$), respectively. The word line WL1 and WL8 are applied with a voltage $V_{CG1}$ ($<V_{CG4}$), and a voltage $V_{CG8}$ ($<V_{CG5}$), respectively. In this way, by applying such different voltages to the word lines WL, variation in erase time is suppressed among the memory cells.

A first modification of the fifth embodiment is described below. In the first modification of the fifth embodiment, a plurality of the word lines WL1-8 connected to one memory string MS are classified into a plurality of groups. For example, the word lines WL1-3 are classified into Group A, the word lines WL6-8 into Group B, and the word lines WL4-5 into Group C. The control circuit AR2 provides different voltages to the different groups, respectively, and provides the same voltage to the plural word lines WL in the same group. For example, Groups A, B, and C are provided with voltages $V_{CG1}$, $V_{CG2}$, $V_{CG3}$, respectively ($V_{CG2}$ is the lowest voltage). In this first modification, the number of types of voltages to be applied may be smaller than in FIG. 13A. Thus, the structure of the control circuit AR2 may be simplified in comparison with the fifth embodiment, and a circuit area can be smaller. A way of the grouping is not limited to the above-described example. For example, the word lines WL1-2 may be classified into Group A, the word lines WL7-8 into Group B, and the word lines WL3-6 into Group C.

Sixth Embodiment

Next, a non-volatile semiconductor memory device according to the sixth embodiment is described with reference to FIG. 14. Since the structure of the non-volatile semiconductor memory device according to the sixth embodiment is similar to those shown in FIG. 1-FIG. 6, the explanation thereof is omitted here. This embodiment provides, similarly to the fifth embodiment, a control method for reducing variation in hole concentration Q due to a GIDL current, and for reducing variation in erase time $T_{erase}$ due to the tapered shape of the memory semiconductor layer 34. However, this embodiment is different from the fifth embodiment in that it employs a method of changing a time period T during which a certain voltage is applied to the word lines WL1-8.

Figure 14:
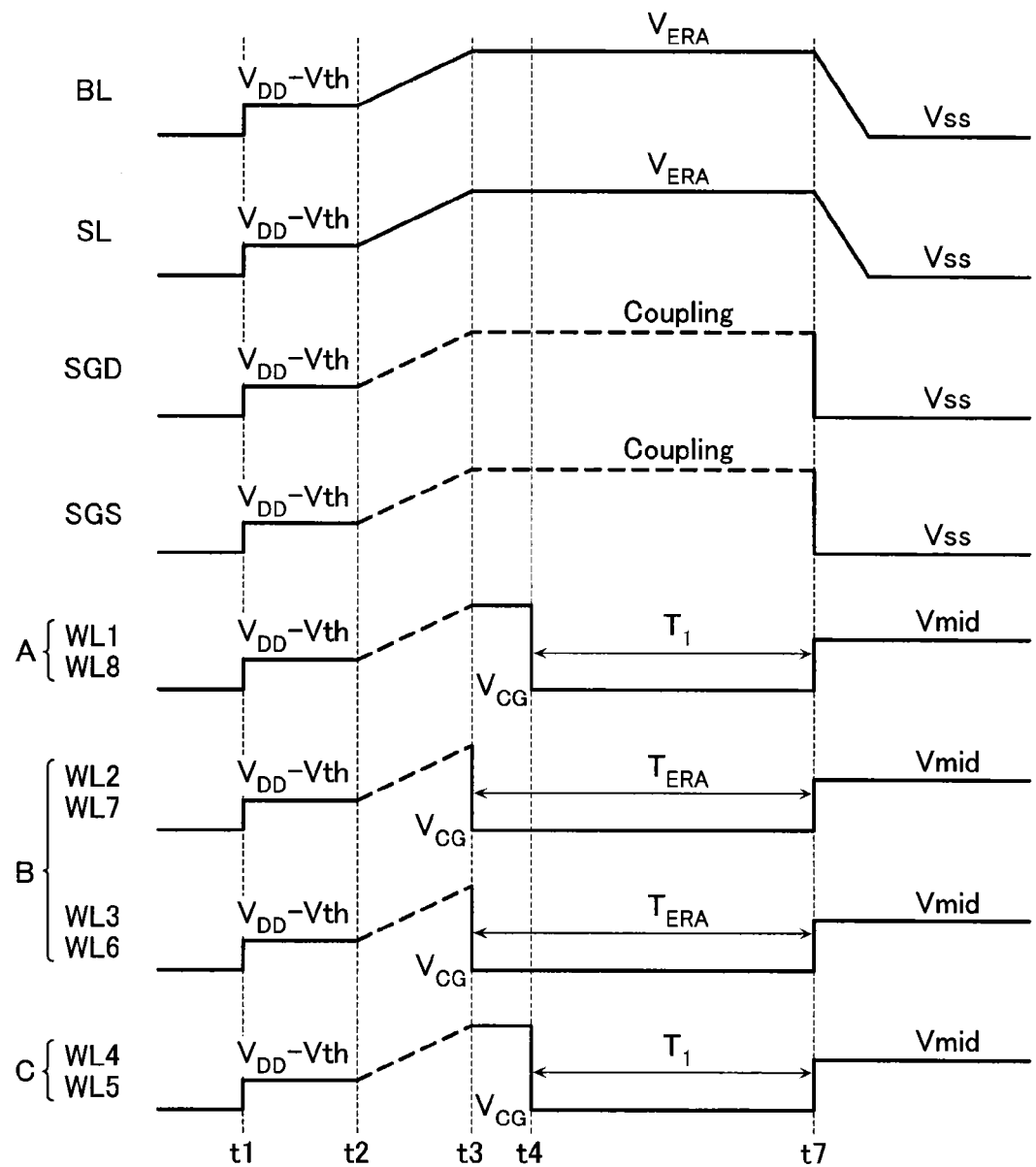
FIG. 14 is a timing chart showing an operation of the non-volatile semiconductor memory device according to the sixth embodiment.

In FIG. 14, the word lines WL0-8 are classified into three Groups A, B, and C. It is assumed here that Group B is judged to need the longest erase time $T_{erase}$ under the same condition among Group A, B, and C. Groups A and C are assumed to need a shorter erase time $T_{erase}$ than Group B.

In this situation, this embodiment starts applying the voltage $V_{CG}$ to the word lines WL2, WL3, WL7 and WL6 in Group B at time t3, and finishes it at time t7 (a time period of $T_{ERA}$). On the other hand, application of the voltage to the word lines WL1 and WL8 in Group A and the word lines WL4 and WL5 in Group C is started at time t4, which is after the time t3, respectively, and is finished at time t7 (a time period of T1).

According to this embodiment, variation in erase time among the memory cells may be suppressed by changing the voltage-application time period as described above when both variation in hole concentration Q due to the GIDL current and variation due to the tapered shape of the memory semiconductor layer 34 occur.

A modification of the sixth embodiment is described below. In the modification of the sixth embodiment, all of the word lines WL1-8 starts application of the voltage $V_{CG}$ at the same time at time t3, and the application of the voltage $V_{CG}$ is finished at different timings among Group A, B, C. This also may provide the same advantage as that of the sixth embodiment.

Seventh Embodiment

Figure 15:
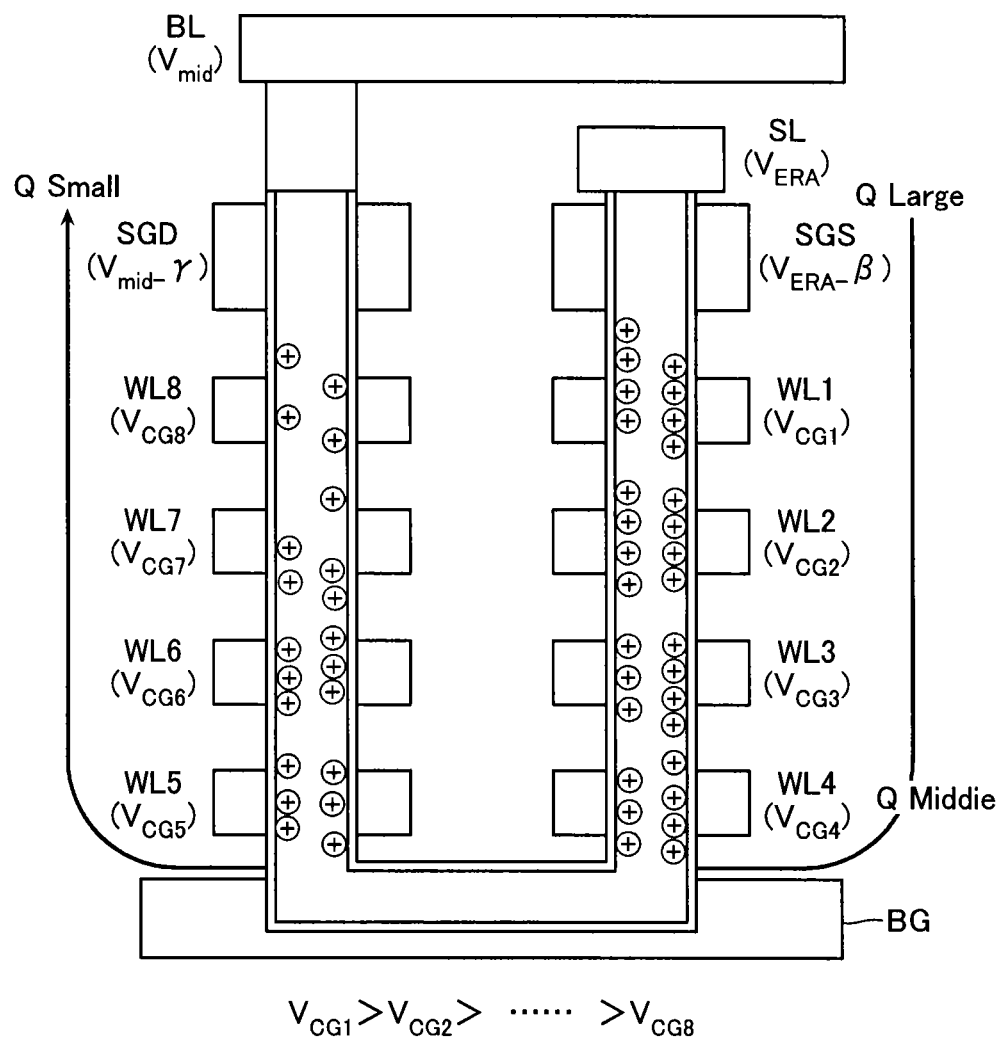
FIG. 15 is a conceptional diagram showing an operation of the non-volatile semiconductor memory device according to the seventh embodiment.

Next, a non-volatile semiconductor memory device according to the seventh embodiment is described with reference to FIG. 15. Since the structure of the non-volatile semiconductor memory device according to the seventh embodiment is similar to those shown in FIG. 1-FIG. 6, the explanation thereof is omitted here. In the above-mentioned embodiments, a method of generating a GIDL current from both of the drain side select transistor SDTr and the source side select transistor SSTr is described. On the other hand, this embodiment generates a GIDL current only in the source side select transistor SSTr. It performs voltage control such that a GIDL current is not generated at the drain side select transistor SDTr.

Next, an erase operation in the non-volatile semiconductor memory device according to the seventh embodiment is described with reference to FIG. 15. In this embodiment, in order to prohibit generation of the GIDL current at the drain side select transistor SDTr, a voltage $V_{mid}$ around 10 V is applied to the bit line BL.

The drain side selection gate line SGD is applied with a voltage $V_{mid}$-γ (around 7-8 V) which is smaller than the voltage $V_{mid}$ by a certain value γ. On the other hand, the source side select transistor SSTr is applied with the voltage $V_{ERA}$ from the source line SL, while being applied with a voltage $V_{ERA}$-β from the source side selection gate line SGS, to generate a GIDL current. In this way, a GIDL current is generated only at the source side select transistor SSTr. As a result of this, it is assumed that hole concentration Q in the memory semiconductor layer 34 is highest near the word line WL1, and lowest near the word line WL8. Note that in this embodiment it is assumed here that the memory semiconductor layer 34 is not formed in a tapered shape, or it is formed in the tapered shape, but the influence thereof may be ignored.

Accordingly, in this embodiment, in order to deal with variation in hole concentration Q, voltages applied to the word lines WL1-8 in an erase operation are set to a lower value as the word line is more distant from the source side select transistor SSTr ($V_{CG1}$>$V_{CG2}$>...>$V_{CG8}$). In this way, voltages applied to the plural word lines WL1-8 in one memory string MS are made different depending on the hole concentration Q. This may equalize the erase time $T_{erase}$ among the memory cells MTr. Equalizing the erase time $T_{erase}$ may reduce extra stress applied to specific memory cells. It also serves to narrow the width of the threshold voltage distribution after the erase operation.

In the above-mentioned example, a GIDL current is generated only at the source side select transistor SSTr. Instead of this, a GIDL current may be generated only at the drain side select transistor SDTr. In this case, an operation shown in FIG. 15 can be performed.

Eighth Embodiment

Next, a non-volatile semiconductor memory device according to the eighth embodiment is described with reference to FIG. 16. Since the structure of the non-volatile semiconductor memory device according to the eighth embodiment is similar to those shown in FIG. 1-FIG. 6, the explanation thereof is omitted here. This eighth embodiment adopts a method of generating a GIDL current only at the source side select transistor SSTr, like in the seventh embodiment. Thus, variation in hole concentration Q occurs.

In this embodiment, instead of changing a value of the voltage to be applied to the plural word lines WL1-8 like the seventh embodiment, voltage control by the control circuit AR2 is performed for changing the time period T among the word lines WL1-8.

Figure 16:
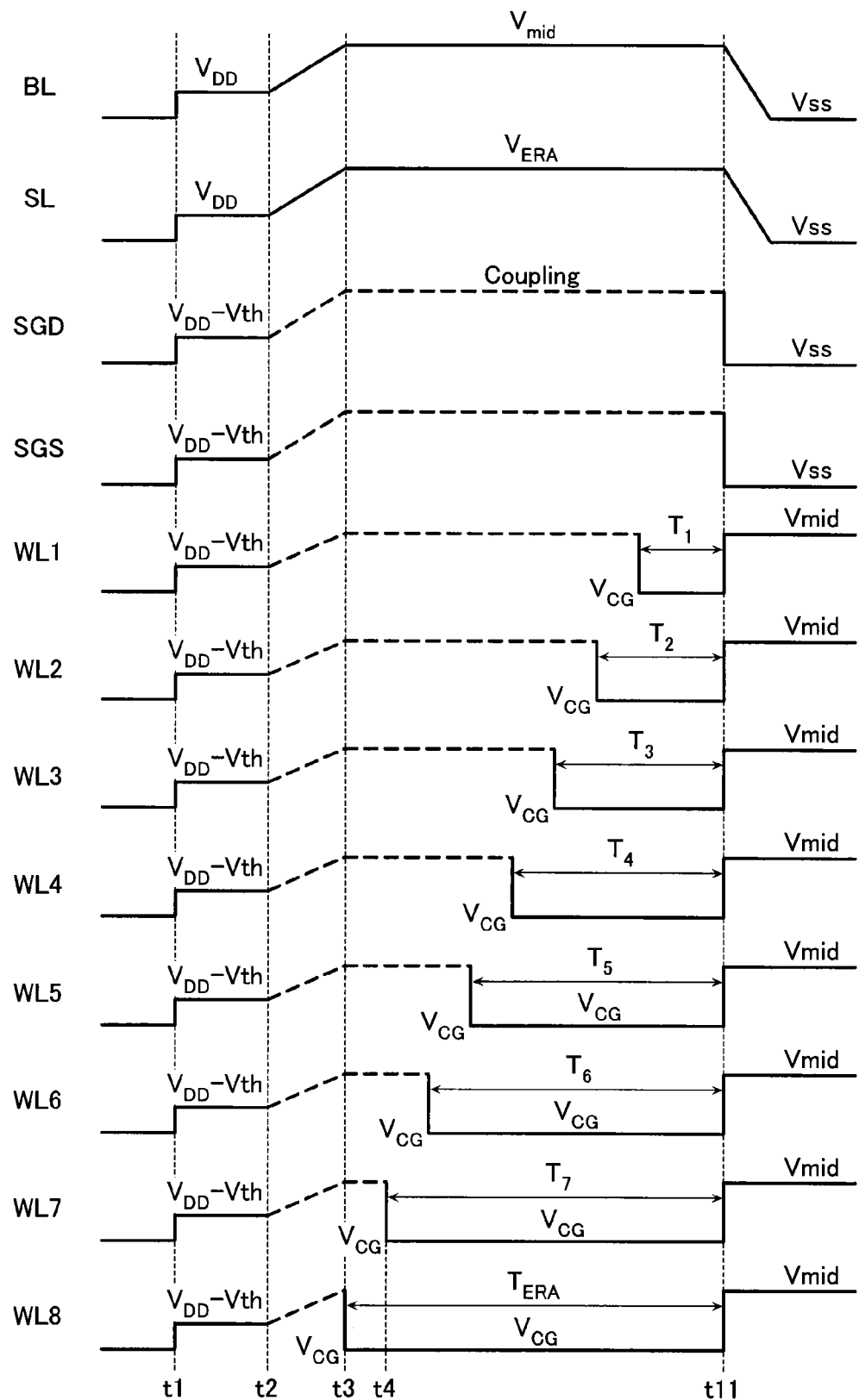
FIG. 16 is a timing chart showing an operation of the non-volatile semiconductor memory device according to the eighth embodiment.

A specific operation of the erase operation is described using a timing chart of FIG. 16. After performing the same operation as the above-described embodiments between time t1 to t3, during a time period after time t3, the voltages of the word lines WL1-8 are lowered sequentially to the voltage $V_{CG}$. The word line WL8 assumed to have the longest erase time $T_{erase}$ under the same condition is provided with the voltage $V_{CG}$ at time t3, which is the earliest timing. The voltage $V_{CG}$ is provided sequentially to the word lines WL. The more distant a word line WL is from the source side select transistor SSTr, at the earlier timing the voltage $V_{CG}$ is provided to the word line WL. At time t11, voltages of all of the word lines WL1-8 return to the voltage $V_{mid}$ (around 10 V) from the voltage $V_{CG}$ at the same time. The same advantage as that of the seventh embodiment may be obtained by changing the time periods T for applying the voltage $V_{CG}$ depending on the distance from the source side select transistor SSTr.

In the example shown in FIG. 16, timings of dropping a voltage to the voltage $V_{CG}$ are different among the word lines WL1-8, and after that, the voltages of the word lines WL1-8 are raised to the voltage $V_{mid}$ at the same time at time t7. Instead of this, it is possible that voltages of the word lines WL1-8 are lowered to the voltage $V_{CG}$ at the same time at t3, and then a timing of raising the voltage to the voltage $V_{mid}$ may be different among the word lines WL1-8 (A word line WL that is more distant from the source side select transistor SSTr returns to the voltage $V_{mid}$ at a later timing).

Ninth Embodiment

Next, a non-volatile semiconductor memory device according to the ninth embodiment is described with reference to FIG. 17A, FIG. 17B. The structure of the non-volatile semiconductor memory device of the ninth embodiment is similar to those shown in FIG. 1-FIG. 6. The ninth embodiment is similar to the first embodiment in that it performs an erase operation by generating a GIDL current at the select transistors SDTr and SSTr. However, the ninth embodiment assumes that defect level is unevenly distributed in the polysilicon which is a material of the memory semiconductor layer 34. For example, when defect level is generated with higher density in the vicinity of the word line WL3 which is located near the middle of the memory semiconductor layer 34 than in the other positions, hole concentration Q becomes the highest in the vicinity of the word line WL3. On the other hand, hole concentration Q becomes the lowest in the vicinity of the word line WL1 and WL8 which are close to the source of the GIDL current (see a graph shown in FIG. 17B). Thus, when the same voltage is applied to all of the word lines WL in an erase operation, electric field E in the memory semiconductor layer 34 becomes strongest in the vicinity of the word line WL3, and becomes weakest in the vicinity of the word lines WL1 and WL8. This causes variation in erase time $T_{erase}$ among the memory cells MTr.

Figure 17A:
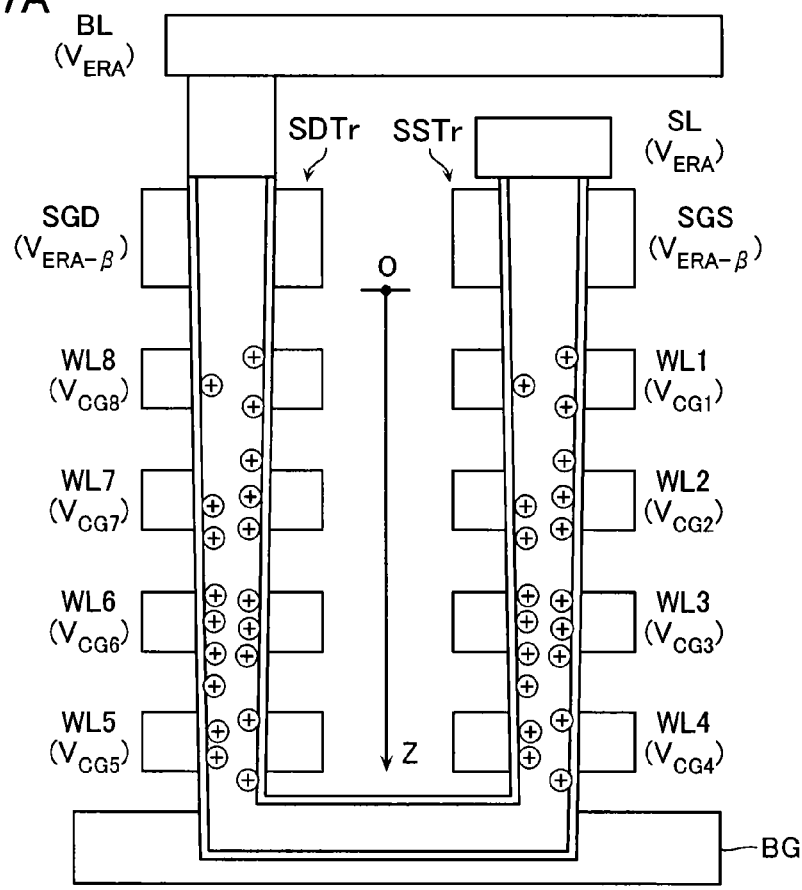
FIG. 17A is a conceptional diagram showing an operation of the non-volatile semiconductor memory device according to the ninth embodiment.
Figure 17B:
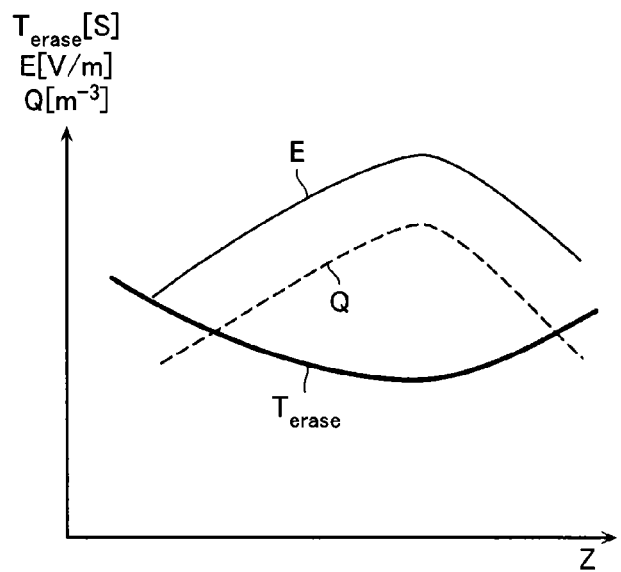
FIG. 17B is a conceptional diagram showing an operation of the non-volatile semiconductor memory device according to the ninth embodiment.

Accordingly, this embodiment sets the voltages to be applied to the word lines WL1-8 in an erase operation to different values explained as follows, as shown in FIG. 17A. The word lines WL1 and WL8 are provided with the smallest voltages $V_{CG1}$, $V_{CG8}$. On the other hand, the word lines WL4 and WL5 are applied with voltages $V_{CG4}$ (>$V_{CG1}$) and $V_{CG5}$ (>$V_{CG8}$) larger than these voltages. Also, the word lines WL2 and WL7 are applied with voltages $V_{CG2}$ (>$V_{CG4}$) and $V_{CG7}$ (>$V_{CG5}$) larger than these voltages. In addition, the word lines WL3 and WL6 are applied with the largest voltages $V_{CG3}$ and $V_{CG6}$. Applying different voltages to different word lines WL may suppress variation in erase time $T_{erase}$ among the memory cells. By Equalizing the erase time $T_{erase}$, extra stress to be applied to specific memory cells may be reduced and widths of the threshold voltage distribution after the erase operation can be narrowed.

Tenth Embodiment

Next, a non-volatile semiconductor memory device according to the tenth embodiment is described with reference to FIG. 18. Since the structure of the non-volatile semiconductor memory device according to the tenth embodiment is similar to those shown in FIG. 1-FIG. 6, the explanation thereof is omitted here.

The tenth embodiment assumes, like in the ninth embodiment, a case in which hole concentration Q becomes the highest in the vicinity of the word line WL3, and hole concentration Q becomes the lowest in the vicinity of the word lines WL1 and WL8, due to variation in distribution of defect level in polysilicon, which is the material of the memory semiconductor layer 34.

Instead of changing values of the voltages to be applied to a plurality of the word lines WL1-8 like in the ninth embodiment, the tenth embodiment performs voltage control in the control circuit AR2 such that a time periods T for applying a voltage $V_{CG}$ are different among the word lines WL1-8.

Figure 18:
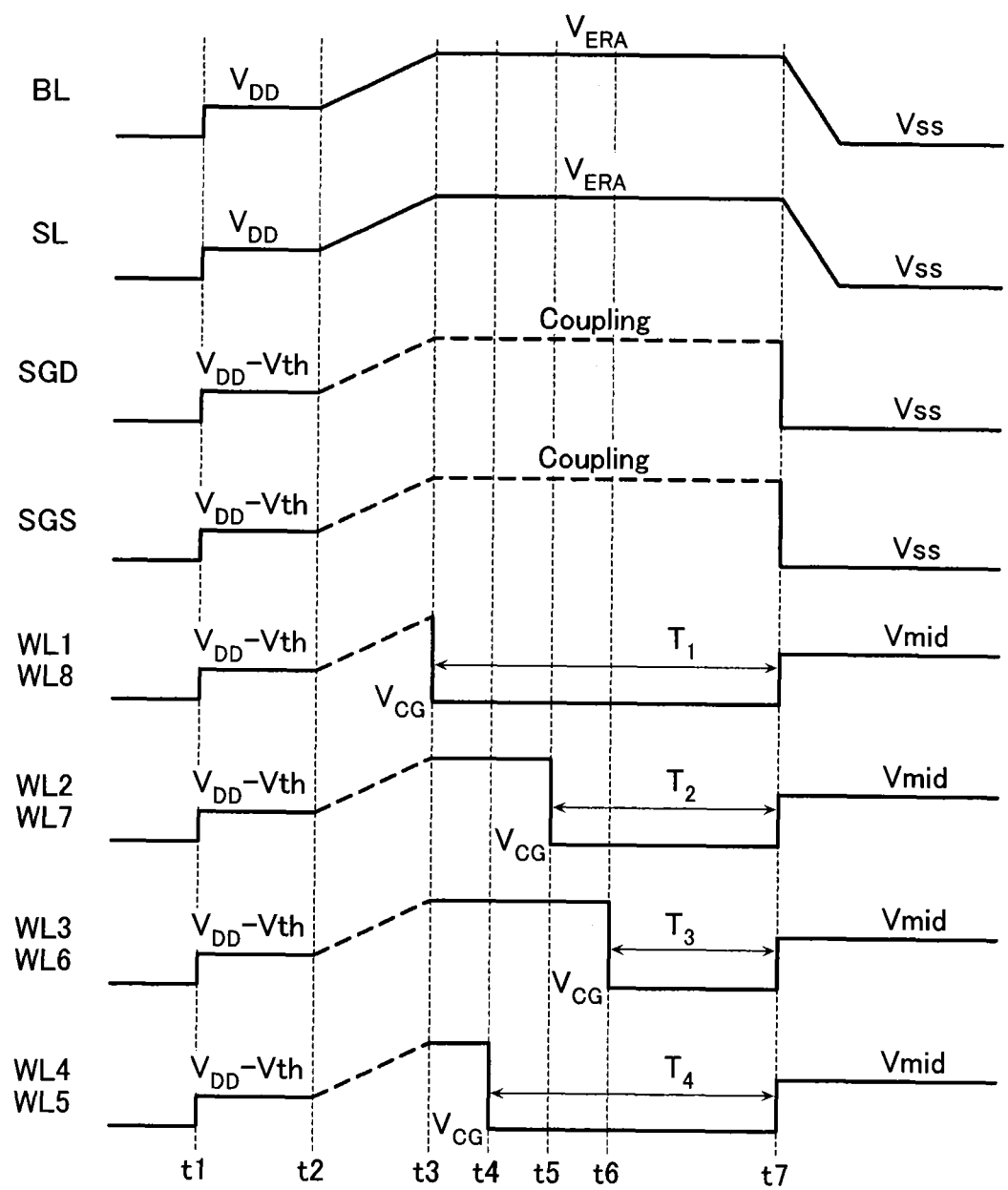
FIG. 18 is a timing chart showing an operation of the non-volatile semiconductor memory device according to the tenth embodiment.

A specific operation in the erase operation is described using a timing chart of FIG. 18.

After performing the same operation as the above-described embodiments, the voltages of the word lines WL1-8 sequentially drop to the voltage $V_{CG}$. The word lines WL1 and WL8 assumed to have the longest erase time $T_{erase}$ under the same condition are applied with the voltage $V_{CG}$ at time t3, which is the earliest timing. The other word lines WL are sequentially applied with the voltage $V_{CG}$. A word line WL with smaller hole concentration Q is provided with the voltage VCG at an earlier timing. At time t7, voltages of all of the word lines WL1-8 return from the voltage $V_{CG}$ to the voltage $V_{mid}$ (around 10 V) all at once.

In this way, a time period T for applying the voltage $V_{CG}$ is changed depending on variation in hole concentration Q. This may obtain the same advantage as that of the ninth embodiment.

OTHERS

Figure 19:
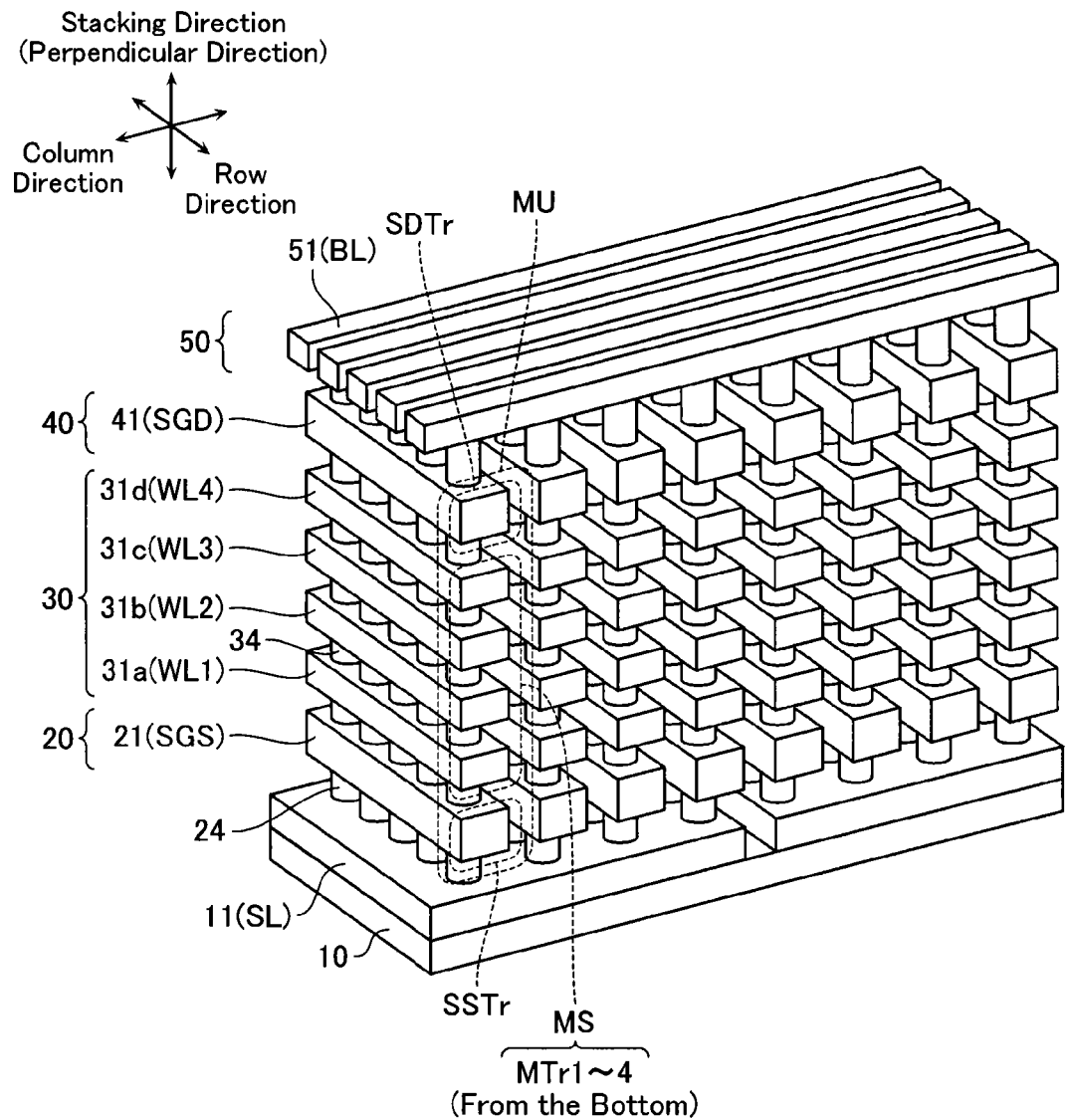
FIG. 19 is a schematic perspective diagram of the memory cell array of the non-volatile semiconductor memory device according to the modification of the embodiment.

In the above-described embodiment, a non-volatile semiconductor memory device having a U-shaped memory semiconductor layer 34 is explained as an example. However, the present invention is not limited to this example. For example, the present invention may be applied to a non-volatile semiconductor memory device having a memory semiconductor layer 34 with a straight-line shape (I-shaped), as shown in FIG. 19. For example, in FIG. 19, when a GIDL current is generated only in the drain side select transistor SDTr, it may cause, as a result, hole concentration Q in the memory semiconductor layer 34 to become larger near an upper word line WL4 and become smaller near the lower word line WL1. In this case, voltage control similar to that of the first and second embodiments may be adopted.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

What is claimed is:

1. A non-volatile semiconductor memory device comprising:
    a memory string including a first memory cell and a second memory cell, the first memory cell being above a semiconductor substrate, the second memory cell being above the first memory cell;
    a first word line electrically coupled to a gate of the first memory cell;
    a second word line electrically coupled to a gate of the second memory cell; and
    a control circuit configured to perform an erase operation on the condition that a first voltage is applied to the first word line during a first period and the first voltage is applied to the second word line during a second period, the second period being shorter than the first period.

2. The device according to claim 1, wherein the memory string includes a third memory cell, the third memory cell is disposed between the first memory cell and the semiconductor substrate, the device further includes a third word line, the third word line is electrically coupled to a gate of the third memory cell, and the control circuit is configured to perform the erase operation on the condition that the first voltage is applied to the third word line during a third period, the third period being shorter than the first period.

3. The device according to claim 1, wherein the memory string includes a first select transistor and a second select transistor, one end of the first select transistor is electrically coupled to a bit line, and one end of the second select transistor is electrically coupled to a source line.

4. The device according to claim 1, wherein the memory string includes a fourth memory cell, the fourth memory cell is disposed between the first memory cell and the second memory cell, the device further includes a fourth word line, the fourth word line is electrically coupled to a gate of the fourth memory cell, and the control circuit is configured to perform the erase operation on the condition that the first voltage is applied to the fourth word line during the first period.

5. The device according to claim 1, wherein the first memory cell includes:
    a first semiconductor layer extending in a direction perpendicular to the substrate;
    a first gate insulating layer surrounding the first semiconductor layer; and
    a first conductive layer surrounding the first gate insulating layer.

6. The device according to claim 1, wherein the memory string includes:
    a first semiconductor layer including a first columnar portion, a second columnar portion, and a first portion, both the first columnar portion and the second columnar portion extending in a direction perpendicular to the substrate, the first portion linking lower ends of first columnar portion and the second columnar portion;
    a charge accumulation layer surrounding the first semiconductor layer; and
    a first conductive layer surrounding the charge accumulation layer.

7. A non-volatile semiconductor memory device comprising:
    a memory string including a plurality of memory cells, the plurality of memory cells including a first group and a second group, the first group including first memory cells, the second group including second memory cells, the second memory cells being disposed above the first memory cells,
    first word lines electrically coupled to the first memory cells;
    second word lines electrically coupled to the second memory cells; and
    a control circuit configured to perform an erase operation on the condition that a first voltage is applied to the first word lines during a first period and the first voltage is applied to the second word lines during a second period, the second period being shorter than the first period.

8. The device according to claim 7, wherein
    the plurality of memory cells includes a third group in addition to the first and second groups, the third group includes third memory cells, and the third memory cells are disposed between the first memory cells and a semiconductor substrate, the device further includes third word lines, the third word lines are electrically coupled to gates of the third memory cells, and the control circuit is configured to perform the erase operation on the condition that the first voltage is applied to the third word lines during a third period, the third period being shorter than the first period.

9. The device according to claim 7, wherein the memory string includes a first select transistor and a second select transistor, one end of the first select transistor is electrically coupled to a bit line, and one end of the second select transistor is electrically coupled to a source line.

10. The device according to claim 7, wherein the plurality of memory cells includes a third group in addition to the first and second groups, the third group includes third memory cells, the third memory cells are disposed between the first memory cell and the second memory cell, the device further includes third word lines, the third word lines are electrically coupled to gates of the third memory cells, and the control circuit is configured to perform the erase operation on the condition that the first voltage is applied to the third word lines during the first period.

11. The device according to claim 7, wherein the first memory cell includes:
   a first semiconductor layer extending in a direction perpendicular to a substrate;
   a first gate insulating layer surrounding the first semiconductor layer; and
   a first conductive layer surrounding the first gate insulating layer.

12. The device according to claim 7, wherein the memory string includes:
   a first semiconductor layer including a first columnar portion, a second columnar portion, and a first portion, both the first columnar portion and the second columnar portion extending in a direction perpendicular to a substrate, the first portion linking lower ends of first columnar portion and the second columnar portion;
   a charge accumulation layer surrounding the first semiconductor layer; and
   a first conductive layer surrounding the charge accumulation layer.

13. A non-volatile semiconductor memory device comprising:
   a memory string including a first memory cell and a second memory cell, the first memory cell being above a semiconductor substrate, the second memory cell being above the first memory cell;
   a first word line electrically coupled to a gate of the first memory cell;
   a second word line electrically coupled to a gate of the second memory cell; and
   a control circuit configured to perform an erase operation on the condition that a first voltage is applied to the first word line and a second voltage is applied to the second word line, the second voltage being smaller than the first voltage.

14. The device according to claim 13, wherein the memory string includes a first select transistor and a second select transistor, one end of the first select transistor is electrically coupled to a bit line, and one end of the second select transistor is electrically coupled to a source line.

15. The device according to claim 13, wherein the first memory cell includes:
   a first semiconductor layer extending in a direction perpendicular to the substrate;
   a first gate insulating layer surrounding the first semiconductor layer; and
   a first conductive layer surrounding the first gate insulating layer.

16. The device according to claim 13, wherein the memory string includes:
   a first semiconductor layer including a first columnar portion, a second columnar portion, and a first portion, both the first columnar portion and the second columnar portion extending in a direction perpendicular to the substrate, the first portion linking lower ends of first columnar portion and the second columnar portion;
   a charge accumulation layer surrounding the first semiconductor layer; and
   a first conductive layer surrounding the charge accumulation layer.

* * * * *